US012757316B2

(12) United States Patent
Alva et al.

(10) Patent No.: US 12,757,316 B2
(45) Date of Patent: Oct. 6, 2026

(54) LOW-PROFILE FASTENERS WITH SPRINGS FOR HEAT TRANSFER DEVICE LOADING

(71) Applicant: Intel Corporation, Santa Clara, CA (US)

(72) Inventors: Samarth Alva, Bangalore (IN); Nagaraj K, Bangalore (IN); Deepak Sekar, Bangalore (IN); Arnab Sen, Whitefield (IN)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 18/059,534

(22) Filed: Nov. 29, 2022

(65) Prior Publication Data

US 2023/0093095 A1 Mar. 23, 2023

(51) Int. Cl.
*H05K 1/02* (2006.01)
*F16B 23/00* (2006.01)

(52) U.S. Cl.
CPC .............. *H05K 1/021* (2013.01); *F16B 23/00* (2013.01); *H05K 2201/0364* (2013.01)

(58) Field of Classification Search
CPC ...................................................... H05K 1/021
See application file for complete search history.

(56) References Cited

U.S. PATENT DOCUMENTS 2,228,217 A * 1/1941 Olson ..................... F16B 39/24 411/957
4,741,654 A * 5/1988 Lovisek .................. F16B 39/26 411/959
7,064,957 B1 * 6/2006 Liang ................... H05K 7/1461 361/709
7,198,445 B2 * 4/2007 Kramer ................... F16B 39/24 411/161
8,964,383 B2 * 2/2015 Degner ................... G06F 1/203 361/679.48
10,764,990 B1 * 9/2020 Chen ...................... H05K 1/021
2009/0168365 A1 * 7/2009 Hsieh .................... H01L 23/427 361/697

OTHER PUBLICATIONS

"Comparison of Multi-coil and Diaphragm Spring Clutches (Automobile)", what-when-how: In Depth Tutorials and Information; accessed Nov. 14, 2022; http://what-when-how.com/automobile/comparison-of-multi-coil-and-diaphragm-spring-clutches-automobile/; 2 pages.

* cited by examiner

*Primary Examiner* — Mukundbhai G Patel
(74) *Attorney, Agent, or Firm* — Alliance IP, LLC

(57) ABSTRACT

Low-profile fasteners with springs that are either integrated with the fastener or are a physically separate component can provide a more evenly distributed load to a heat transfer device, such as a vapor chamber or a heat pipe. The low-profile fasteners do not increase the height of the base of a mobile computing device as the spring and the portion of the fastener that extends past the spring fit within a recess or cavity of the heat transfer device. The spring can be a diaphragm spring, a wave spring, or another suitable spring. The use of low-profile fasteners with springs to fasten a heat transfer device to a mainboard may allow for designs with a smaller mainboard area, which can leave room for a larger thermal management solution (which can increase cooling capacity) and allow for a greater thermal design power for the system.

24 Claims, 11 Drawing Sheets

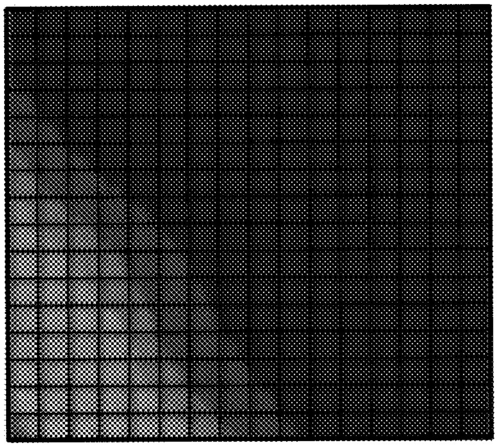
FIG. 12A
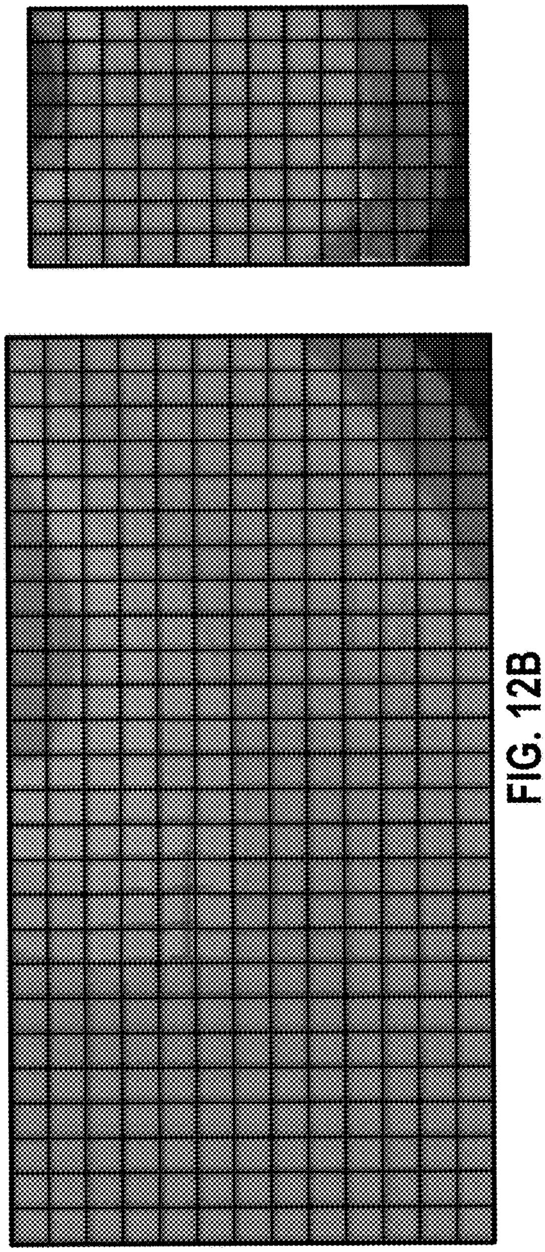
FIG. 12B
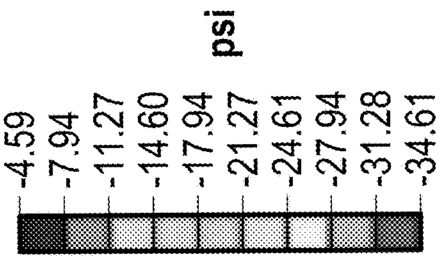

LOW-PROFILE FASTENERS WITH SPRINGS FOR HEAT TRANSFER DEVICE LOADING

BACKGROUND

In some existing computing devices, screws are used to provide mechanical loading to a heat transfer device, such as a vapor chamber or a heat pipe, to help ensure that a low thermal resistance connection is maintained between the heat transfer device and one or more heat generating components, such as a system on a chip, central processor unit or a graphics processor unit.

BRIEF DESCRIPTION OF THE DRAWINGS

FIGS. 12A-12B illustrate simulated mechanical load across a single-processor and dual-processor mainboard configurations in which a vapor chamber is attached to the mainboard with three low-profile fasteners.

DETAILED DESCRIPTION

Figure 1:
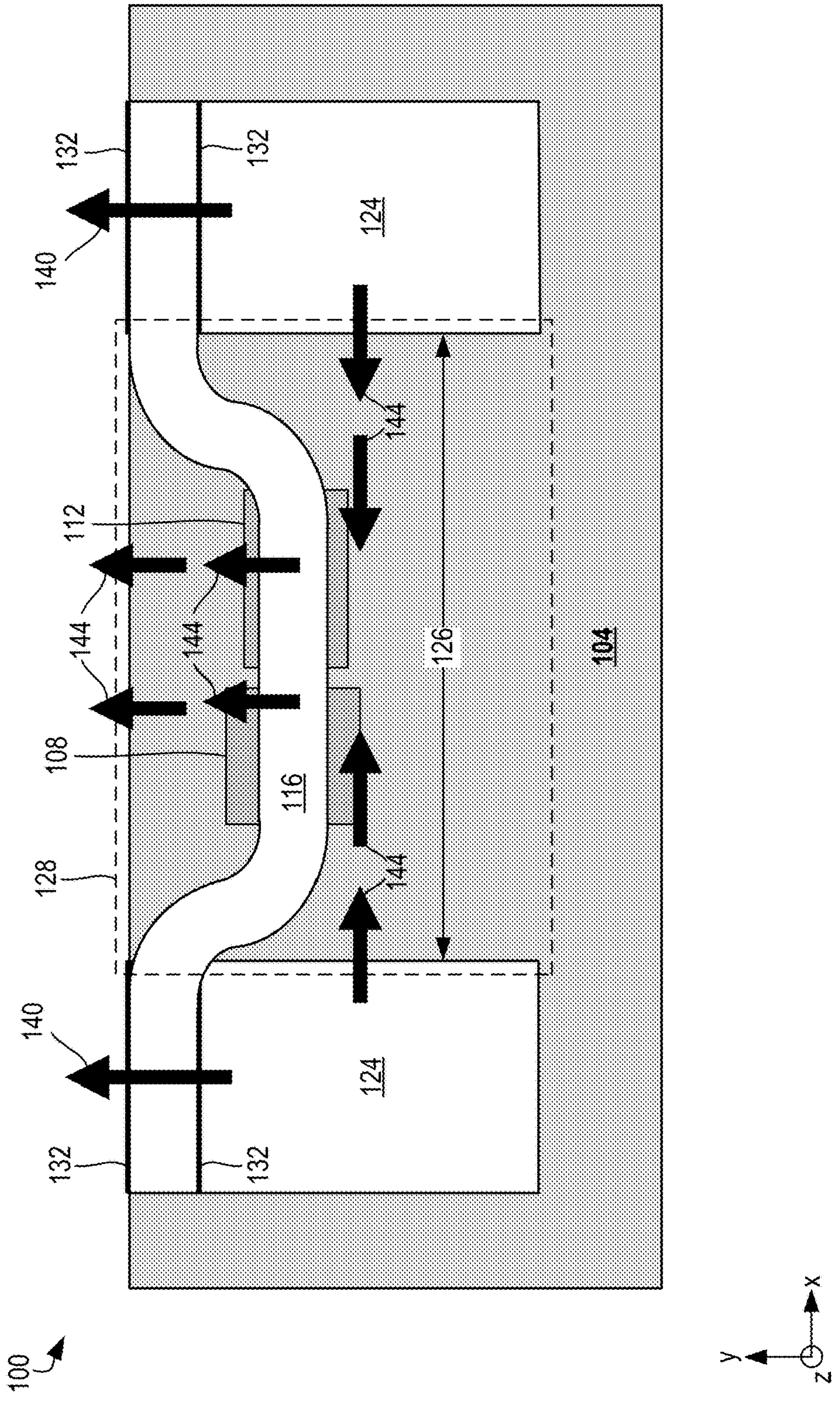
FIG. 1 is a simplified illustration of the physical architecture of the base of an example high-performance laptop.

The trend to make mobile computing devices, such as laptops, thinner and lighter continues to grow. At the same time, there is a demand by industry that these devices be capable of high performance. FIG. 1 is a simplified illustration of the physical architecture of the base of an example high-performance laptop. The base 100 comprises a central processor unit (CPU) 108, a graphics processor unit (GPU) 112, and a mainboard 104 upon which the CPU 108 and GPU 112 are located. The CPU 108 and GPU 112 are located within a core region 128 of the mainboard 104. The thermal management solution used in the base 100 to cool the CPU 108 and the GPU 112 comprises a heat pipe 116 that is located on the CPU 108 and the GPU 112 at the center of the heat pipe 116 and attached to fins 132 located on either side of the core region 128 at the ends of the heat pipe 116. The heat pipe 116 transfers heat generated by the CPU 108 and GPU 112 to the fins 132. The thermal management solution further comprises air movers (not shown in FIG. 1) located in cutouts 124. The air movers cause air to move over the fins 132, as indicated by arrows 140. In some embodiments, the air movers can be dual output fans that cause air to move over the fins 132 as well as through the core region 128 and out a vent in the base 100, as indicated by arrows 144.

As laptop performance is in part based on the size of the air movers that can be implemented in a system, it is desirable to have large cutouts 124. The size of the cutouts 124 depends in part on the width 126 of the core region 128, which, even with dense and strategic placement of electronic components and signal routing, can be driven primarily by the x-dimension distance needed to route the heat pipe 116 from the CPU 108 and GPU 112 to the fins 132. The width 126 of the core region 128 can further depend on the number of fasteners (or studs, not shown in FIG. 1) used to attach the heat pipe 116 to the mainboard 104 as the fasteners consume valuable mainboard real estate that could otherwise be used for signal routing. In some existing laptops with a base having a physical design similar to base 100, the width 126 of the core region 128 can be in the range of 125-130 mm.

In some existing laptops, a vapor chamber can be used instead of a heat pipe as the heat transfer device. The use of a vapor chamber can enable laptop bases with a mainboard core region that is narrower than those in which a heat pipe is used. In some existing laptops with the base having a physical design similar to base 100 and in which a vapor chamber is used as the heat transfer device, the width of the core region of the mainboard can be about 106 mm. Laptop bases that comprise a vapor chamber as part of the thermal management solution may comprise a plate to which the vapor chamber is attached to provide structural support for the vapor chamber. This increase in structural support can come at the cost of an increase in the height of the base by the thickness of the support plate, as in some existing systems the stack of components that includes the main processor unit for the system (e.g., system-on-a-chip (SoC), CPU) drives the base height. In some systems, the addition of this plate can increase the base height by about 0.5-0.6 mm. In order to enable systems with thin base heights, designs may compromise on the thermal design power of the system and/or the cooling capacity of the system. These plates can also complicate the assembly process by requiring the plate to be soldered to the vapor chamber. The plate further adds to the weight of the laptop. In some systems, the addition of a vapor chamber support plate increases the weight of the thermal management solution by about 15-20%. The fasteners used to attach the heat transfer device to the mainboard can also impact the height of the base. For example, with reference to FIG. 6A, the height of a laptop base can depend on the combined height that a leaf spring 608 and a head 606 extend from the surface of a heat transfer device 612.

Described herein are low-profile fasteners with springs for the loading of heat transfer devices in computing systems. In addition to providing a mechanical attachment of a heat transfer device to a mainboard (or motherboard, printed circuit board), the fasteners provide mechanical loading to the heat transfer device to compress a layer of thermal interface material (TIM) located between the heat transfer device and the heat-generating electronic components (e.g., CPU, GPU). This loading helps ensure a low thermal resistance path between the heat-generating components and the heat transfer device. The spring helps provide a more evenly distributed load across the surface of the spring to the component being fastened. The spring can be a diaphragm spring or another suitable spring, such as a wave spring (e.g., single wave spring, split wave spring) and can be part of the fastener or a physically separate component that slips over the shaft of the fastener and abuts the head of the fastener.

The disclosed fasteners with springs have at least the following advantages. First, the use of a fastener with a spring can aid in generating a larger load in a smaller dimension relative to other fasteners. This can help reduce the number of mounting holes used to provide a desired amount of loading to a heat transfer device. For example, in some existing solutions, eight mounting holes are used to attach a vapor chamber to a mainboard-four holes to fasten the vapor chamber to the mainboard in the vicinity of a CPU (one fastener in the vicinity of each corner of the CPU) and another four holes to fasten the vapor chamber to the mainboard in the vicinity of a GPU (one fastener in the vicinity of each corner of the GPU). Using the low-profile fasteners with springs disclosed herein, three or four mounting holes can provide a desired loading to a heat transfer device. Reducing the number of holes in a vapor chamber also reduces the reduction in Qmax of the vapor chamber (the maximum heat carrying capacity of the vapor chamber) resulting from the presence of the holes. Second, the combined height of the spring and the portion of the fastener that extends past the spring can fit within a recess or cavity of a heat transfer device located in the vicinity of a mounting hole. Thus, in these embodiments, the combined height of the spring and the portion of the fastener that extends past the spring does not contribute to the height of the base.

In the following description, specific details are set forth, but embodiments of the technologies described herein may be practiced without these specific details. Well-known structures and techniques have not been shown in detail to avoid obscuring an understanding of this description. Phrases such as “an embodiment,” “various embodiments,” “some embodiments,” and the like may include features, structures, or characteristics, but not every embodiment necessarily includes the particular features, structures, or characteristics.

Some embodiments may have some, all, or none of the features described for other embodiments. “First,” “second,” “third,” and the like describe a common object and indicate different instances of like objects being referred to. Such adjectives do not imply objects so described must be in a given sequence, either temporally or spatially, in ranking, or any other manner. “Connected” may indicate elements are in direct physical or electrical contact with each other and “coupled” may indicate elements cooperate or interact with each other, but they may or may not be in direct physical or electrical contact. Furthermore, the terms “comprising,” “including,” “having,” and the like, as used with respect to embodiments of the present disclosure, are synonymous. Terms modified by the word “substantially” include arrangements, orientations, spacings, or positions that vary slightly from the meaning of the unmodified term. For example, substantially circular cutouts can refer to cutouts that are close to circular (elliptical, oval, etc.) but are not perfectly circular.

As used herein, the phrase “located on” in the context of a first layer or component located on a second layer or component refers to the first layer or component being directly physically attached to the second part or component (no layers or components between the first and second layers or components) or physically attached to the second layer or component with one or more intervening layers or components.

As used herein, the term “integrated circuit component” refers to a packaged or unpackaged integrated circuit product. A packaged integrated circuit component comprises one or more integrated circuit dies mounted on a package substrate with the integrated circuit dies and package substrate encapsulated in a casing material, such as a metal, plastic, glass, or ceramic. In one example, a packaged integrated circuit component contains one or more processor units mounted on a substrate with an exterior surface of the substrate comprising a solder ball grid array (BGA). In one example of an unpackaged integrated circuit component, a single monolithic integrated circuit die comprises solder bumps attached to contacts on the die. The solder bumps allow the die to be directly attached to a printed circuit board. An integrated circuit component can comprise one or more of any computing system component described or referenced herein or any other computing system component, such as a processor unit (e.g., system-on-a-chip (SoC), processor core, graphics processor unit (GPU), accelerator, chipset processor), I/O controller, memory, or network interface controller.

As used herein, the term “electronic component” can refer to an active electronic component (e.g., processor unit, memory, storage device, FET) or a passive electronic component (e.g., resistor, inductor, capacitor).

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

Figure 2B:
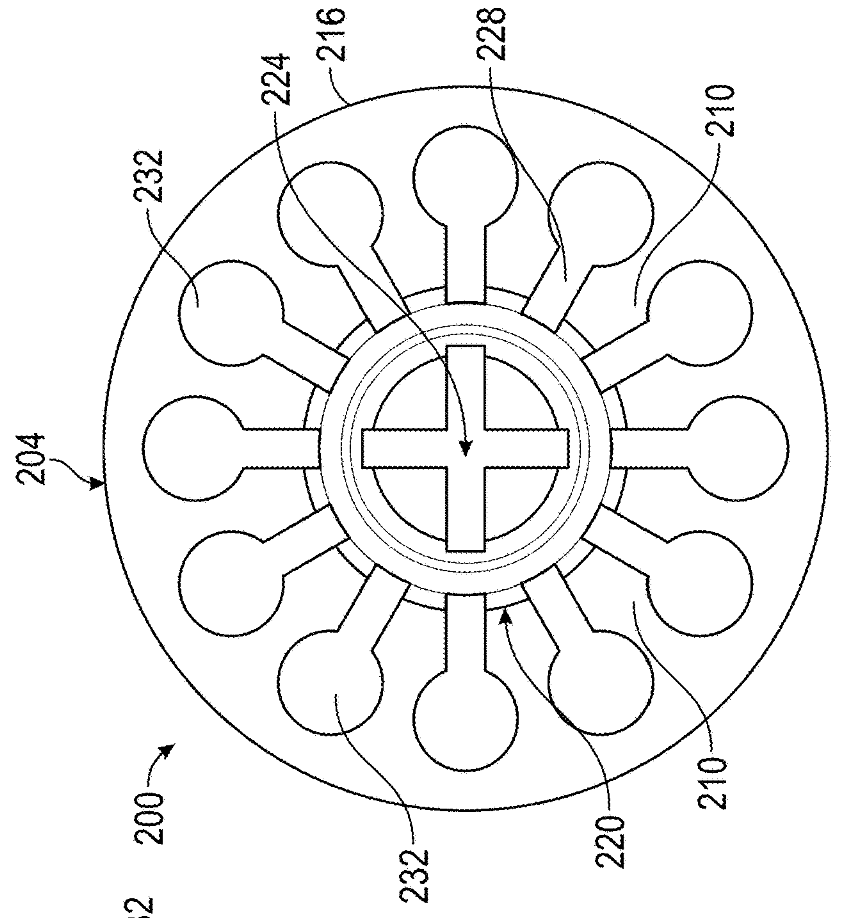
FIGS. 2A-2B are perspective and top-down views, respectively, of an example fastener.
Figure 2A:
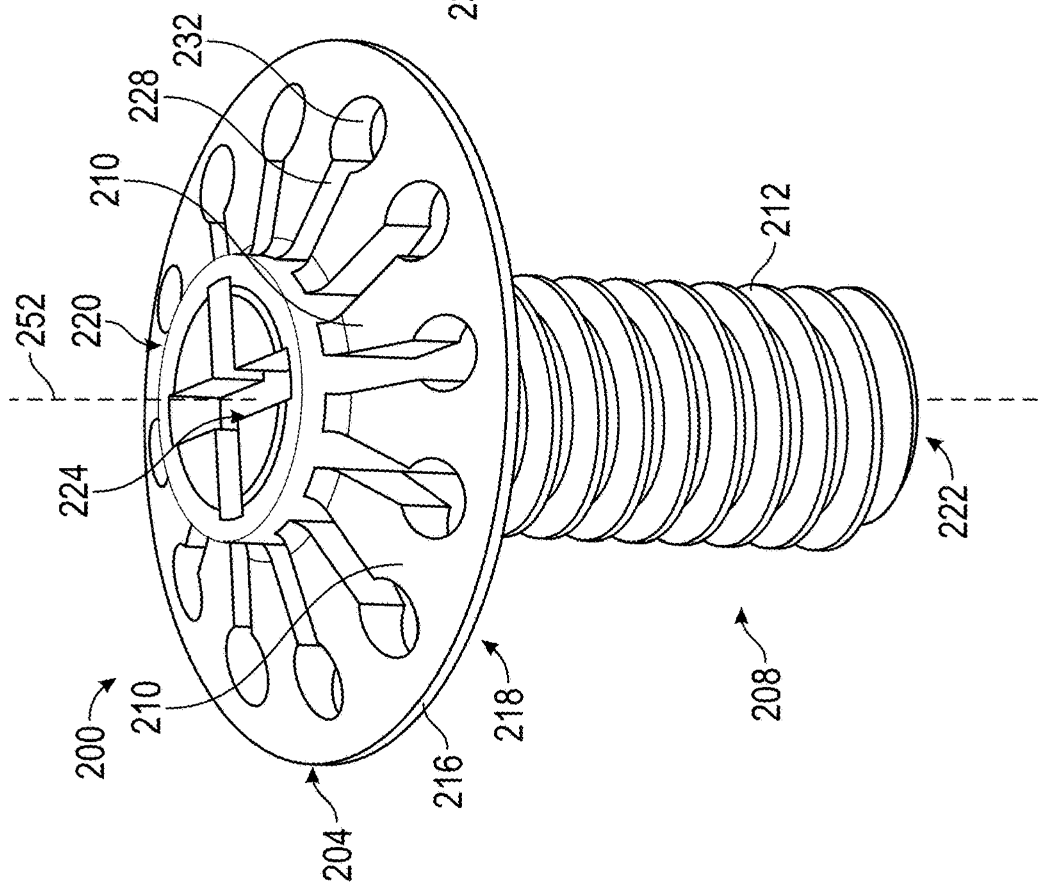

FIGS. 2A-2B are perspective and top-down views, respectively, of an example fastener. The fastener 200 comprises a spring 204 and a shaft 208. The shaft 208 has a cylindrical shape and extends from a first end 220 to a second end 222. The shaft 208 comprises threads 212 located on an outer surface of the shaft 208. The threads 212 are shown as extending along the length of the shaft from the second end 222 to the spring 204, but in other embodiments, the threads 212 can extend along a portion of the length of the shaft. The spring 204 is located at the first end 220 and is coaxially aligned with the shaft 208. A spring described herein as being located at an end of a shaft can refer to a spring located near the end of the shaft where a portion of the shaft extends past the spring. The first end 220 comprises a driver 224 for receiving a drive tool, such as a screwdriver. As the diameter of the first end 220 is the same as the diameter along the remainder of the shaft 208, the fastener 200 can be considered to be headless. The spring 204 is attached to the first end 220 of the shaft 208 and a portion of the shaft 208 extends past the spring 204. In other embodiments, the spring 204 is physically separate from the shaft 208. The spring 204 and the shaft 208 can comprise steel (e.g., stainless steel, spring steel), copper, or other suitable material.

The spring 204 is a diaphragm spring and comprises spokes 210 that extend radially outward from a central axis 252 to an outer portion 216. The spokes 210 are attached to the outer portion 216 and an individual spoke 210 is physically separated from an adjacent spoke 210 by a gap 228 that extends along the length of the individual spoke 210. A gap 228 comprises a cutout 232 at the end of the gap 228 proximal to the outer portion 216. The width (e.g., diameter) of the cutout 232 is greater than a width of the gap 228 along the length of the gap 228 that does not include the cutout 232. The cutout 232 is substantially circular, but in other embodiments, gaps 228 can comprise cutouts having other suitable shapes, such as oval, triangular, etc. In some embodiments, gaps between spokes do not have a cutout. Cutout size, shape, and the number of cutouts in a spring can be varied to help achieve a desired mechanical loading.

When the fastener 200 is attached to a fastener receiver (such as a nut), the spring 204 flattens as the bottom face 218 of the spring 204 is pressed against a surface of a component (such as a vapor chamber or a heat pipe) that is being secured by the fastener 200. The spring 204 can enable the provision of a desired load with a fastener having a lower profile than a fastener that employs a coil or conical spring to deliver the load. The load distribution across the bottom face 218 of the spring 204 may be more even than the load distributed across the bottom face of a washer or head of other types of fasteners. As mentioned above, it is desirable to use fewer fasteners in a design as fewer fasteners consume less mainboard real estate. This can enable mainboards with narrower core regions, which can in turn allow for larger air movers to be utilized, which can further in turn allow for a greater thermal design power for the system.

To reduce the number of fasteners, each fastener must on average be able to provide a larger mechanical load. In fasteners employing a conical or coil spring, a larger (taller) spring may be needed to provide the desired load, which can increase the height of the base. For example, a conical coil spring may require a working length of 2.0-2.5 mm. The disclosed low-profile fasteners with a diaphragm spring can provide a desired load (in part) through appropriate selection of the diaphragm spring height, thickness and angle (see discussion of FIGS. 4A-4B below), with the low-profile fastener still being able to fit within a recess or cavity of a heat transfer device and thus not cause an increase in base height.

Figure 3A:
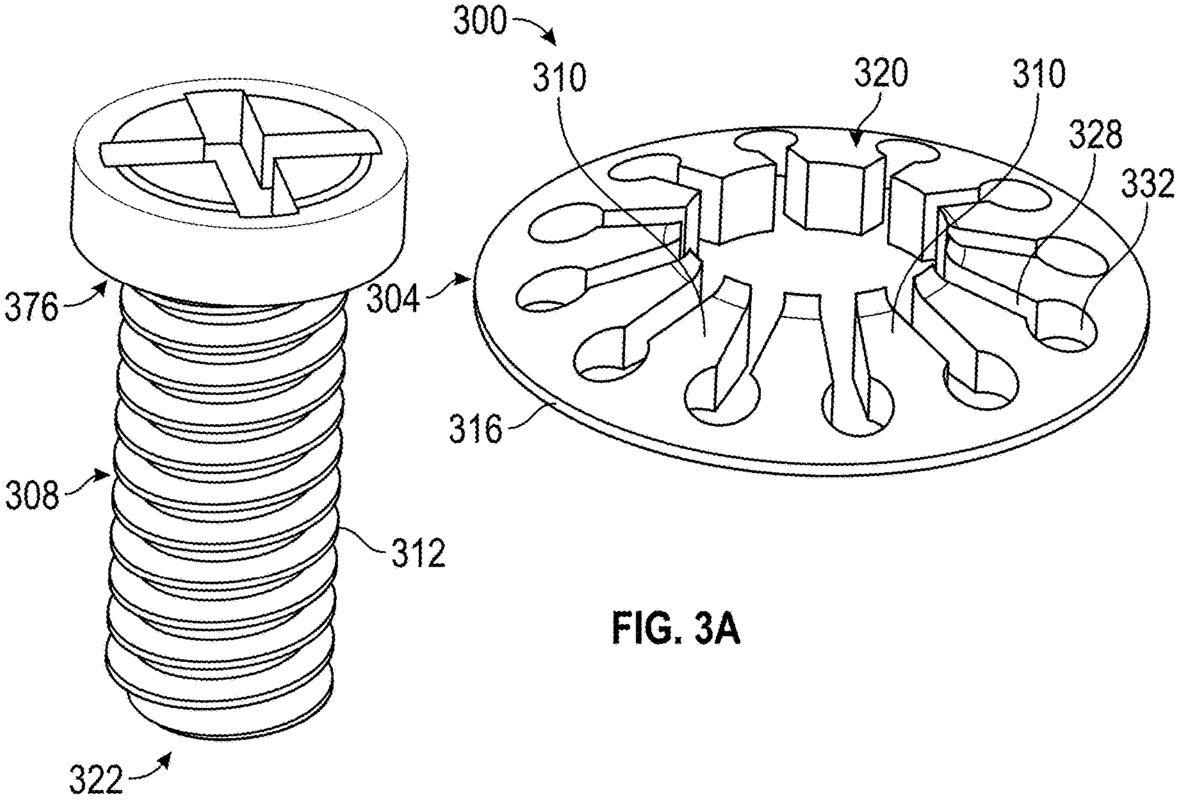
FIGS. 3A-3B illustrate an example low-profile fastener and diaphragm spring that is a physically separate component from the fastener.
Figure 3B:
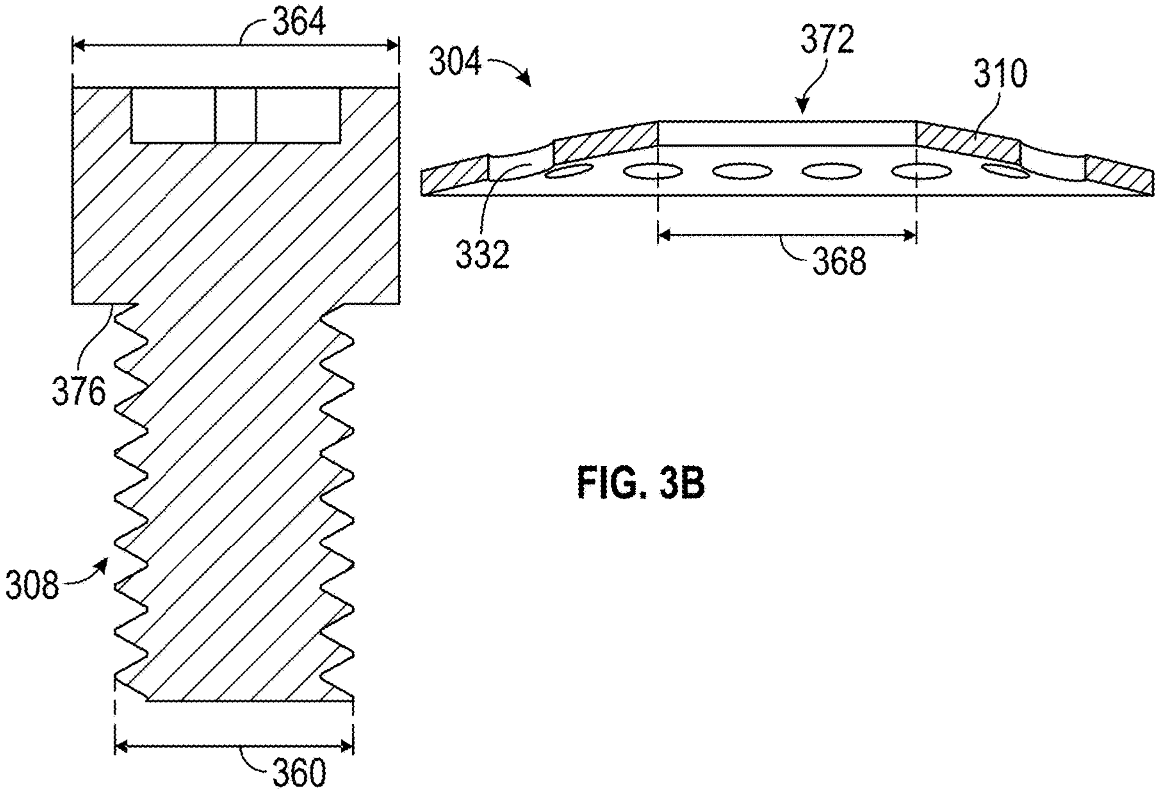

FIGS. 3A-3B illustrate an example low-profile fastener and diaphragm spring that is a physically separate component from the fastener. The fastener 300 comprises a shaft 308. The shaft 308 has a cylindrical shape and extends from a first end 320 to a second end 322. The shaft 308 comprises threads 312 located on an outer surface of the shaft 308. A diameter 364 of the first end 320 of the shaft 308 is greater than a diameter 360 along the remainder of the shaft 308. The spring 304 comprises an opening 372 at its center that has an opening diameter 368. The spring 304 comprises spokes 310 that are attached to an outer portion 316 and an individual spoke 310 is physically separated from an adjacent spoke 310 by a gap 328 that extends along the length of the individual spoke 310. A gap 328 comprises a cutout 332 at the end of the gap 328 proximal to the outer portion 316. The diameter 368 is greater than the diameter 360 of the shaft 308 and less than the diameter 364 of the shaft 308 such that the spring 304 can fit over the second end 322 of the shaft 308 and slide along the shaft 308 until it abuts a bottom surface 376 of the first end 320. The spring 304 is coaxially aligned with the shaft 308 when the spring 304 is placed on the shaft 308.

Figure 4A:
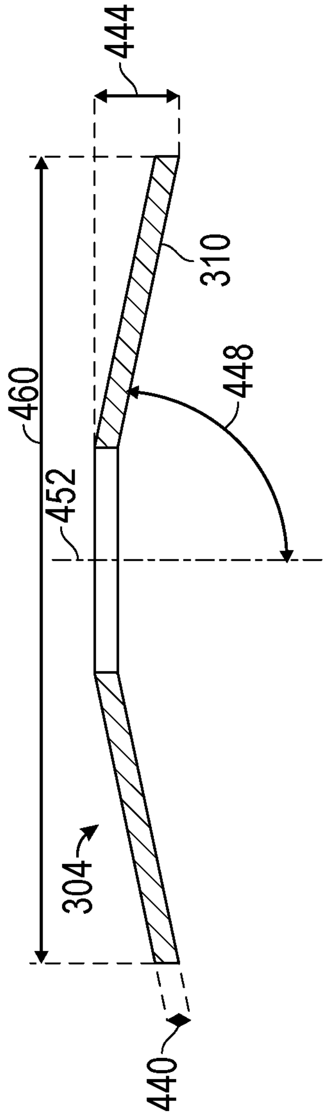
FIGS. 4A-4B are cross-sectional views of the spring of FIGS. 3A-3B in uncompressed and compressed states, respectively.
Figure 4B:
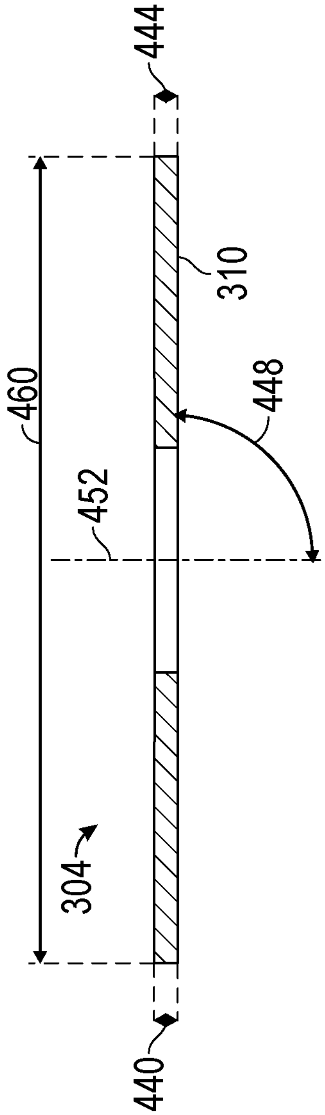

FIGS. 4A-4B are cross-sectional views of the spring of FIGS. 3A-3B in uncompressed and compressed states, respectively. The spring 304 has a thickness 440. When the spring 304 is uncompressed, the spring 304 has a height 444 and an angle 448 between a central axis 452 of the spring 304 and spokes 310. When the spring 304 is compressed after being driven by a drive tool, the height 444 of the spring 304 is reduced. In some embodiments, the outer diameter of the spring (e.g., diameter 460 of the spring 304) can be in the range of 6-8 mm when the spring is compressed. Spring parameters (e.g., angle 448, height 444, thickness 440, number of cutouts) can be varied based on a desired mechanical load to be applied. The use of thicker heat transfer devices for increased cooling capacity can allow for thicker springs to be used without the fastener impacting base height.

Figure 5:
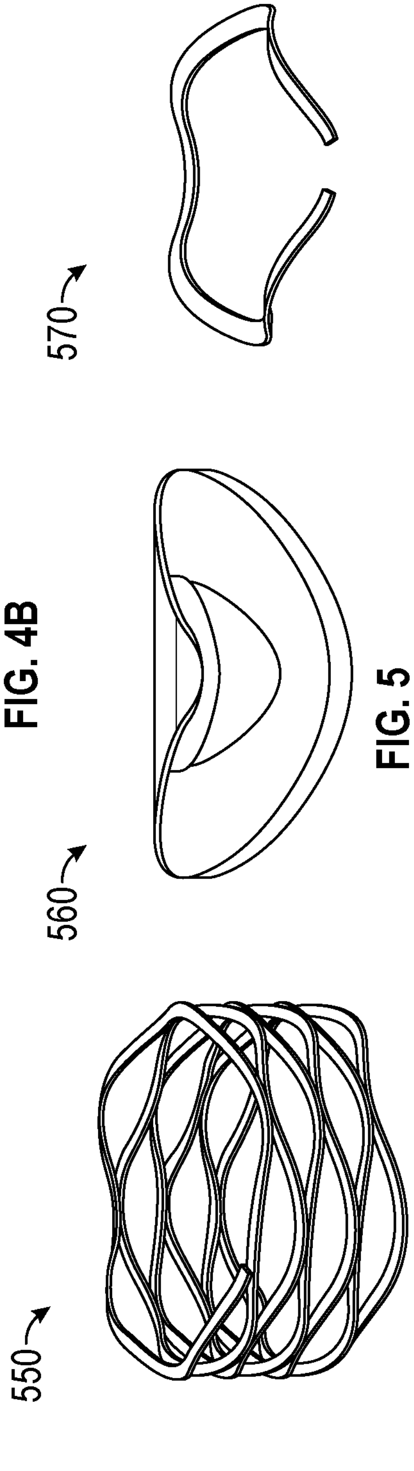
FIG. 5 illustrates example wave springs that can be used with low-profile fasteners.

In some embodiments, suitable spring types other than a diaphragm spring can be used with the low-profile fasteners disclosed herein. FIG. 5 illustrates example wave springs that can be used with low-profile fasteners—a wave spring 550 comprising multiple coils, a single wave spring 560, and a split wave spring 570. In some embodiments, the wave springs 550 and 560 can have a working height of less than one millimeter and the split wave spring 570 can have a working height of less than 0.5 mm. Any spring used with a low-profile fastener can be integrated with the fastener or be a physically separate component from the fastener.

Figure 6A:
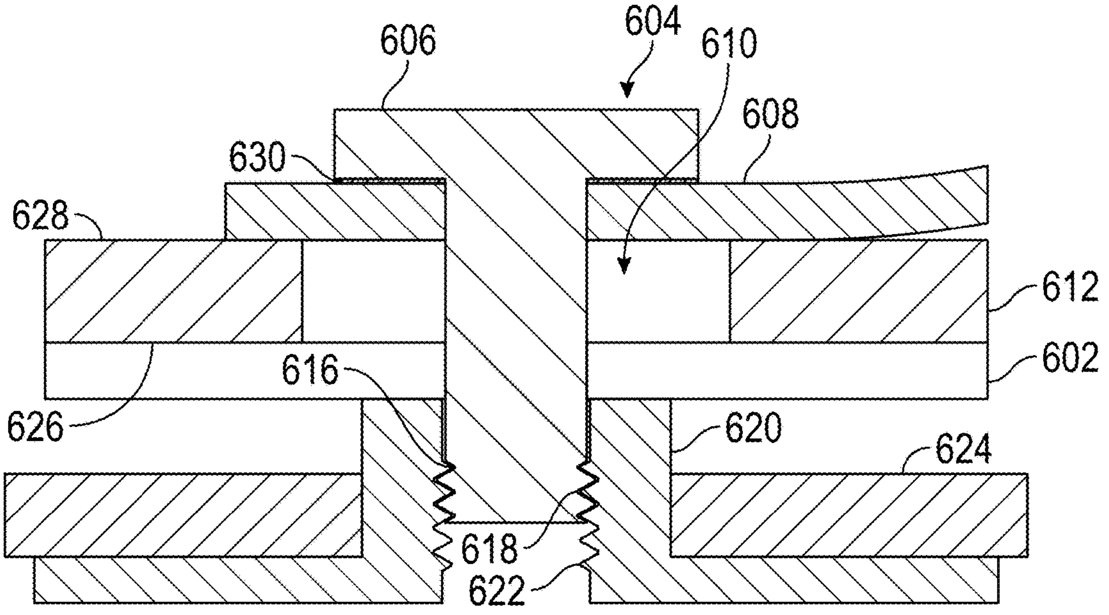
FIGS. 6A-6B illustrate example fasteners that fasten a heat transfer device from a top surface of the heat transfer device.
Figure 6B:
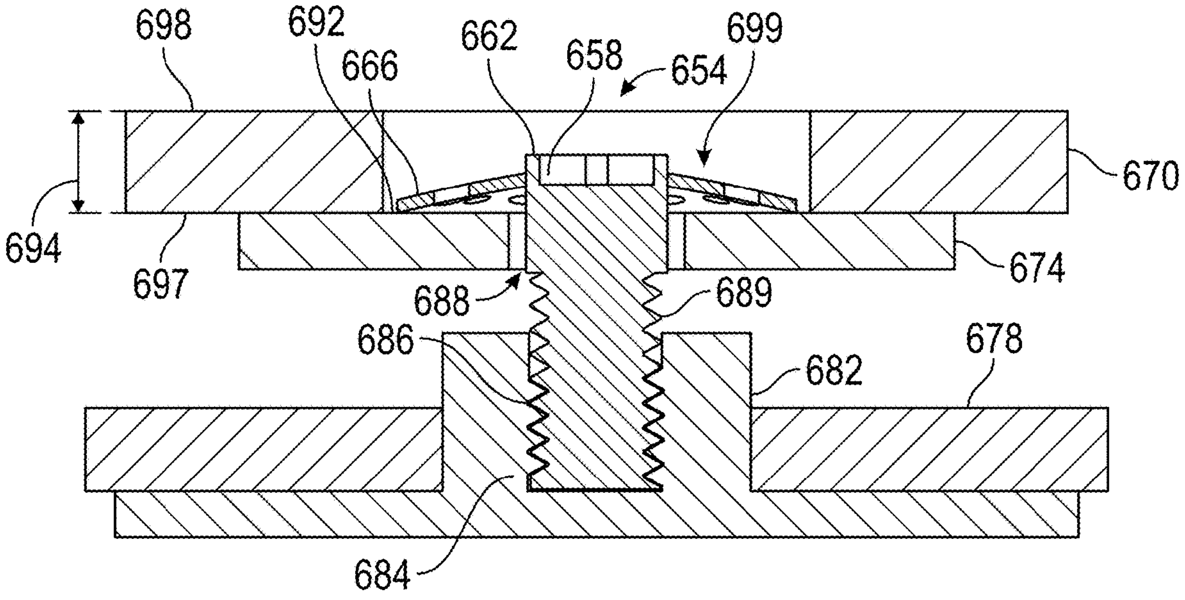

FIGS. 6A-6B illustrate example fasteners that fasten a heat transfer device from a top surface of the heat transfer device. With reference to FIG. 6A, a fastener 604 comprises a head 606 and a shaft 616. The fastener 604 passes through a hole 610 in heat transfer device 612, with threads 618 of the shaft 616 engaging with threads 622 of a nut 620 integrated into a mainboard 624 to fasten the heat transfer device 612 to the mainboard 624. A leaf spring 608 is positioned between the head 606 and the heat transfer device 612 and is located on a top surface 628 of the heat transfer device 612 to provide loading to the heat transfer device 612. An adhesive layer 630 is located between the head 606 and the leaf spring 608. A plate 602 is attached to a bottom surface 626 of the heat transfer device 612 to provide structural support for the heat transfer device 612. The combined height of the head 606 and the leaf spring 608 extends past the top surface 628 of the heat transfer device 612.

With reference to FIG. 6B, a low-profile fastener 654 comprises a spring 666 and a shaft 686. Threads 689 of the shaft 686 engage with threads 684 of a nut 682 integrated into a mainboard 678 to fasten a heat transfer device 670 to the mainboard 678. The fastener 654 comprises a head 658 located at an end 662 of the shaft 686. A step 674 extends past a bottom surface 697 of the heat transfer device 670. The step 674 can be a separate component, such as a plate, that is attached to the heat transfer device 670 (as shown), or the step 674 can be part of the heat transfer device 670. For example, a step that extends past a bottom surface of a vapor chamber can be formed by shaping bottom and/or top plates of a vapor chamber, such as step 724 formed in bottom plate 708 and step 720 formed in top plate 704 of vapor chamber 700 illustrated in FIGS. 7A-7B.

The fastener 654 passes through a hole 688 in the step 674 with the spring 666 positioned against a top surface 692 of the step 674. The combined height of the spring 666 and the portion of the fastener 654 that extends beyond the spring 666 is less than a depth 694 of a recess (or cavity) 699 in the heat transfer device 670 that accommodates the fastener 654. That is, the end 662 of the shaft 686 does not extend past a top surface 698 of the heat transfer device 670 when the fastener 654 is inserted into the hole 688 and the spring 666 is compressed. Thus, the use of a low-profile fastener 654 in place of the fastener 604 and the leaf spring 608 can reduce the system height by an amount equal to the combined height of the head 606, the adhesive layer 630, and the leaf spring 608. For example, if the heights of the head 606, adhesive layer 630, and the leaf spring 608 are 0.3, 0.1, and 0.4 mm, respectively, the use of the low-profile fastener 654 can reduce the system height by 0.8 mm. In some embodiments, the total height of the base of a laptop having a thermal design power (TDP) of 60 W can be 10.2 mm. Thus, the use of low-profile fasteners disclosed herein can reduce the base height to 9.4 mm, a reduction of about 8%.

The heat transfer devices 612 and 670, as well as any other heat transfer device described herein can be a two-phase heat transfer device (a heat transfer device comprising a cavity comprising a working fluid that aids in the transport of heat by transitioning between its liquid and gas phases), such as a vapor chamber or a heat pipe. In some embodiments, the heat transfer device can be another suitable heat transfer device, such as a cold plate through which a working fluid can flow to remove heat generated by heat-generating components. A cold plate can be any suitable type of cold plate, such as a tubed cold plate or a cold plate comprising internal fins or channels (e.g., microchannels), and be made of any suitable material, such as copper, aluminum, or stainless steel that is chemically compatible with working fluids.

Figure 7A:
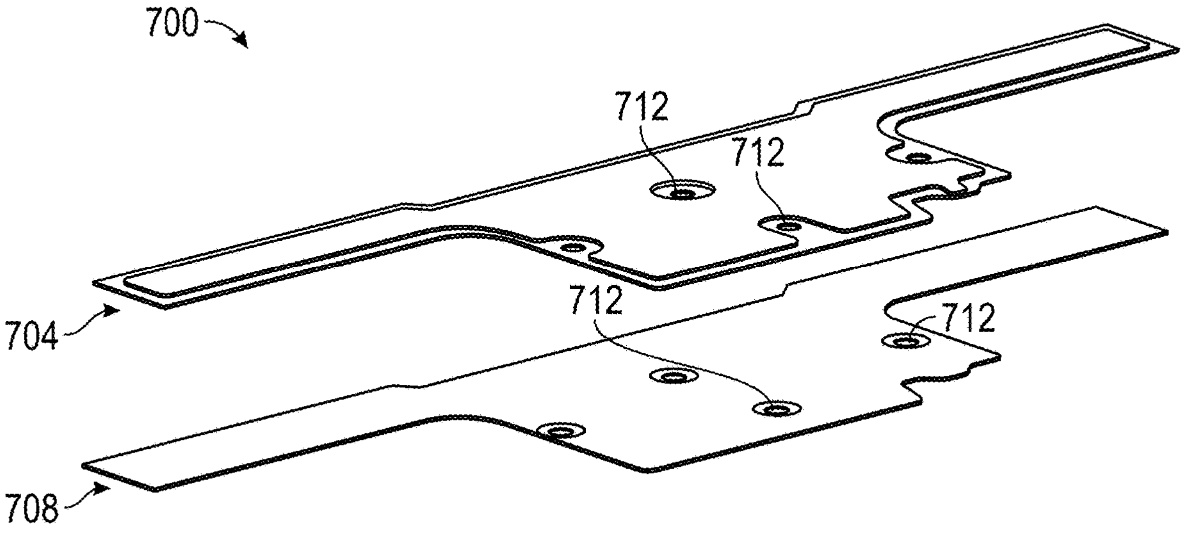
FIG. 7A is an exploded perspective view of an example vapor chamber.
Figure 7B:
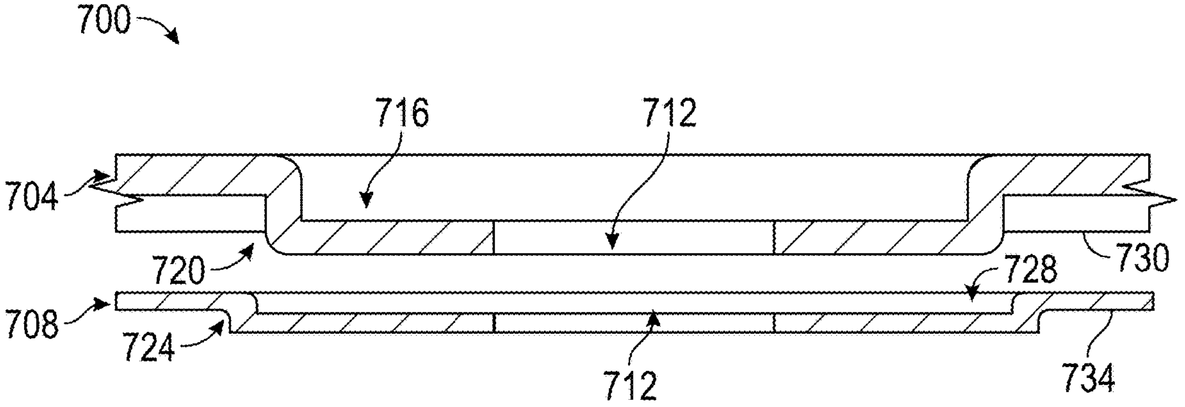
FIG. 7B is a cross-sectional view of the vapor chamber of FIG. 7A in the vicinity of one of the holes through the vapor chamber.

FIG. 7A is an exploded perspective view of an example vapor chamber. The vapor chamber 700 comprises a top plate 704 and a bottom plate 708. Four holes 712 extend through the top and bottom plates 704 and 708. FIG. 7B is a cross-sectional view of the vapor chamber of FIG. 7A in the vicinity of one of the holes 712. In the vicinity of each hole 712 there is a recess (or cavity) 716 in the top plate 704 and a recess (or cavity) 728 in the bottom plate 708. A step 720 extends from a surface 730 of the top plate and a step 724 extends from a surface 734 of the bottom plate 708. The step 720 of the top plate 704 fits within the recess 728 of the bottom plate 708.

One benefit of creating the recesses and steps in the top and bottom plates of a vapor chamber as shown in FIGS. 7A-7B is that the vapor chamber can be made structurally strong in the vicinity of the holes without having to attach additional plates or fasteners onto a vapor chamber surface. This eliminates the risk of an added plate from detaching from the vapor chamber when a mechanical load from loading elements (e.g., the low-profile fasteners disclosed herein) is applied.

Figure 8A:
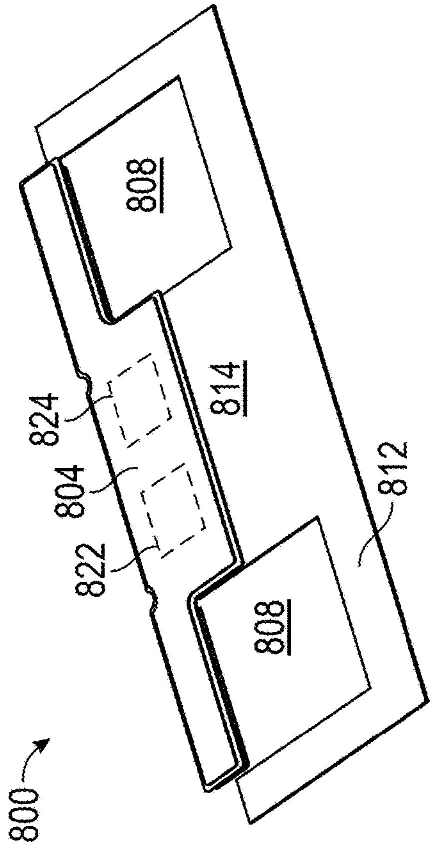
FIGS. 8A and 8B are perspective top and bottom views, respectively, of an apparatus comprising a mainboard with an attached heat transfer device.
Figure 8B:
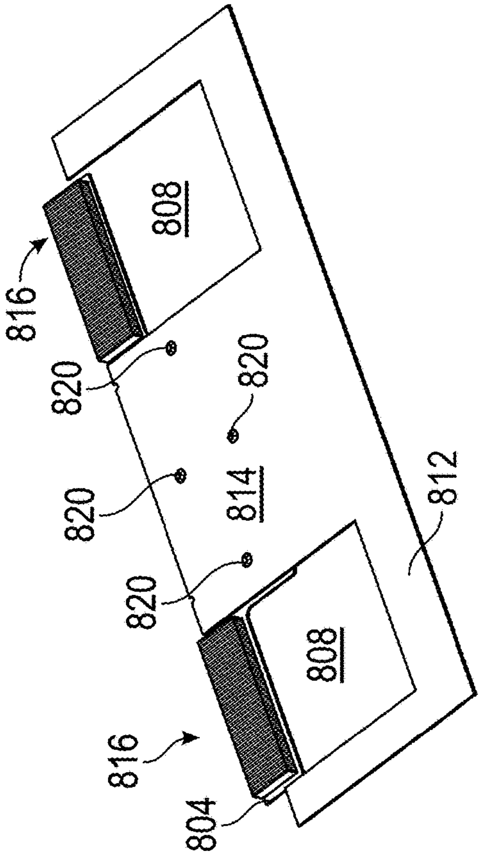
Figure 8C:
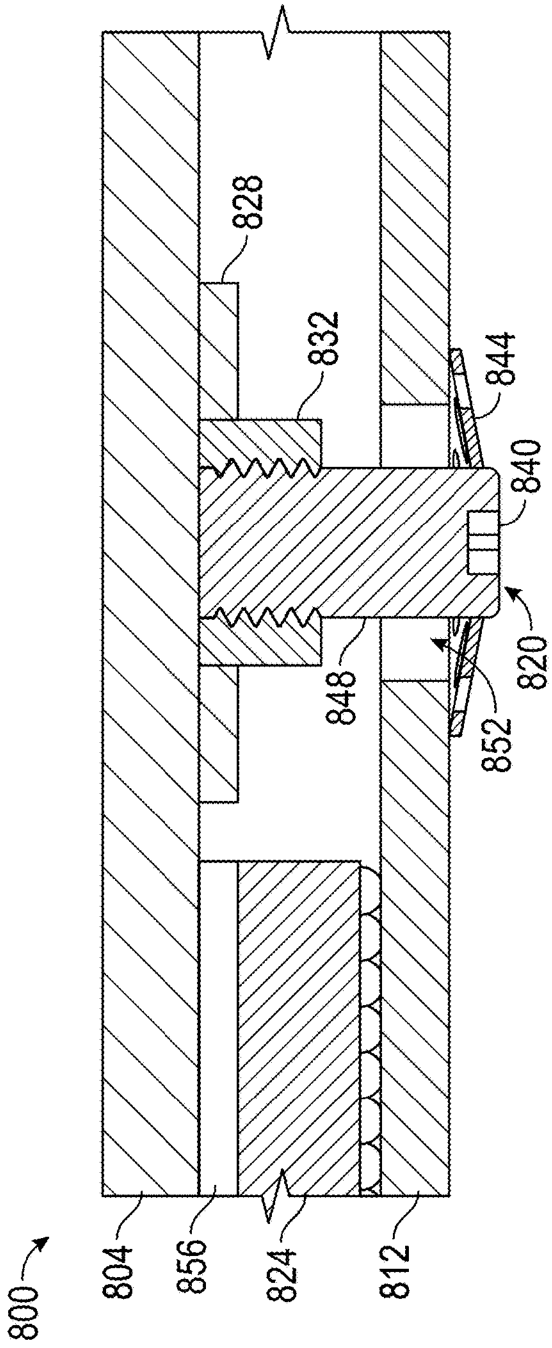
FIG. 8C is a cross-sectional view of the apparatus of FIGS. 8A-8B taken in a vicinity of one of the fasteners.

FIGS. 8A-8C are views of a heat transfer device fastened to a mainboard by an example low-profile fastener attaching to a nut located on a vapor chamber surface. FIGS. 8A and 8B are perspective top and bottom views, respectively, of an apparatus 800 comprising a mainboard with an attached heat transfer device. Mainboard 812 comprises a core region 814 with air mover cutouts 808 on either side of the core region 814. Vapor chamber 804 is fastened to the mainboard by four low-profile fasteners with springs and provides a low thermal resistance path for heat generated by CPU 822 and GPU 824 (positioned between the vapor chamber 804 and the mainboard 812) to the fins 816.

FIG. 8C is a cross-sectional view of the apparatus of FIGS. 8A-8B taken in a vicinity of one of the fasteners 820. The fastener 820 comprises a drive 840, a spring 844, and a shaft 848. The fastener 820 passes through a hole 852 in the mainboard 812 and threads into a nut 832 attached to the vapor chamber 804. The nut 832 can be located in a feature 828 of the vapor chamber 804. A TIM layer 856 is positioned between the vapor chamber 804 and the GPU 824. The TIM layer 856 and any other TIM layer described or referenced herein can be any suitable material, such as a silver thermal compound, thermal grease, phase change materials, indium foils or graphite sheets.

Figure 9A:
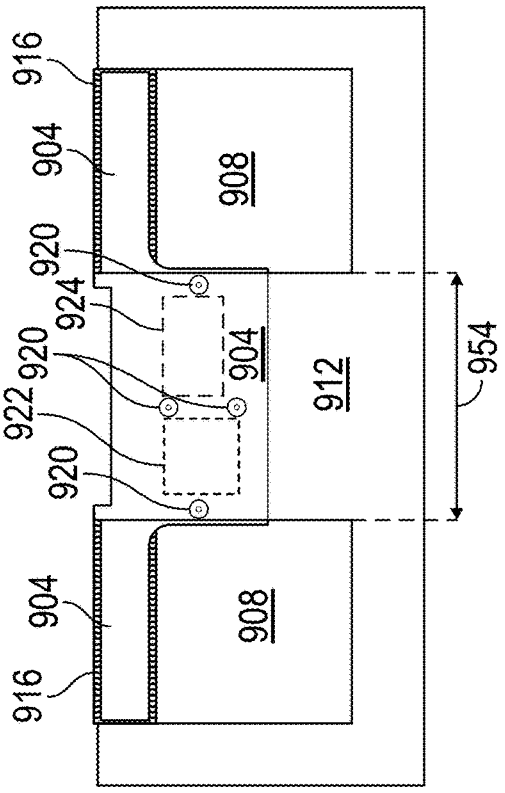
FIGS. 9A-9B are top and perspective views, respectively, of a vapor chamber attached to a mainboard with four example low-profile fasteners.
Figure 9B:
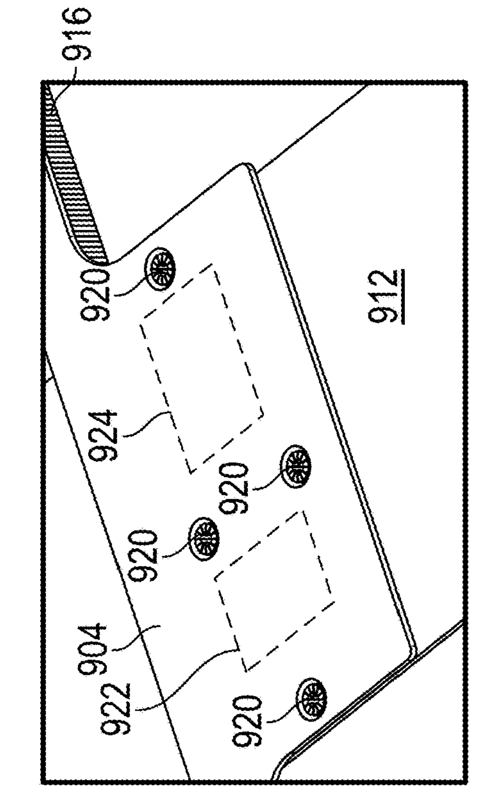
Figure 10A:
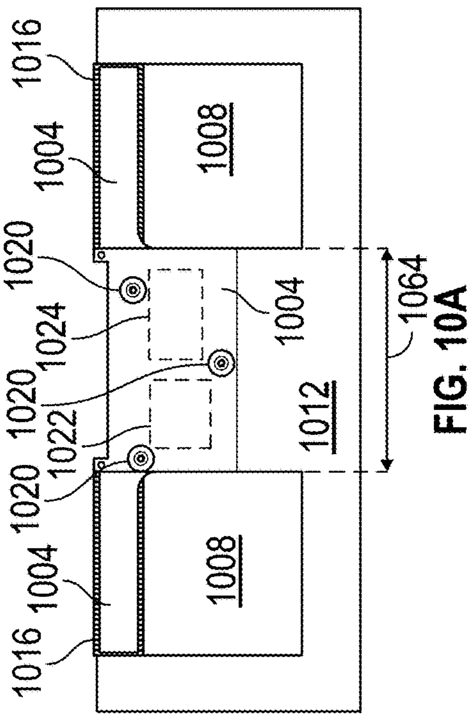
FIGS. 10A-10B are top and perspective views, respectively, of a vapor chamber attached to a mainboard with three example low-profile fasteners.
Figure 10B:
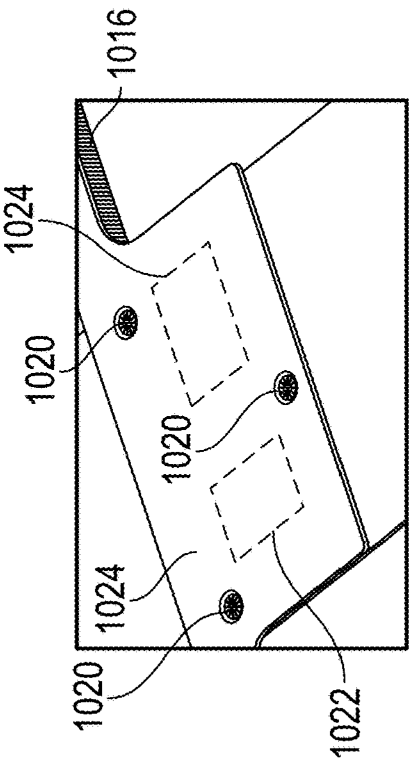

FIGS. 9A-9B are top and perspective views, respectively, of a vapor chamber attached to a mainboard with four example low-profile fasteners. Vapor chamber 904 provides a low thermal resistance path from CPU 922 and GPU 924 to fins 916 and is attached to mainboard 912 by four low-profile fasteners 920. The mainboard 912 comprises a core region having a width 954 with air mover cutouts 908 on either side of the core region. FIGS. 10A-10B are top and perspective views, respectively, of a vapor chamber attached to a mainboard with three example low-profile fasteners. Vapor chamber 1004 provides a low thermal resistance path from CPU 1022 and GPU 1024 to fins 1016 and is attached to mainboard 1012 by three low-profile fasteners 1020. The mainboard 1012 comprises a core region having a width 1064 with air mover cutouts 1008 on either side of the core region.

Fastening a heat transfer device to a mainboard having a configuration as illustrated in FIGS. 1, 8A-8B, 9A-9B, and 10A-10B (a core region with air mover cutouts on either side of the core region) with three or four of the low-profile fasteners as described herein can enable a core region having a width (e.g., widths 126, 954, 1064) of about 100 mm or less, which is less than mainboard core region widths in designs with vapor chambers having eight holes and designs employing heat pipes as the heat transfer device. Having three or four holes in a vapor chamber instead of eight holes can also increase the Qmax of the vapor chamber and allow the thermal design power of a 60 W system having a vapor chamber with eight holes to be increased to about 70 W. While FIGS. 9A-9B and 10A-10B illustrate three- and four-hole solutions to attach a vapor chamber to a mainboard with an attached CPU and GPU, three- and four-hole solutions can be used for attaching a vapor chamber to a mainboard with just one hotspot (e.g., a single CPU or SOC).

Figure 11A:
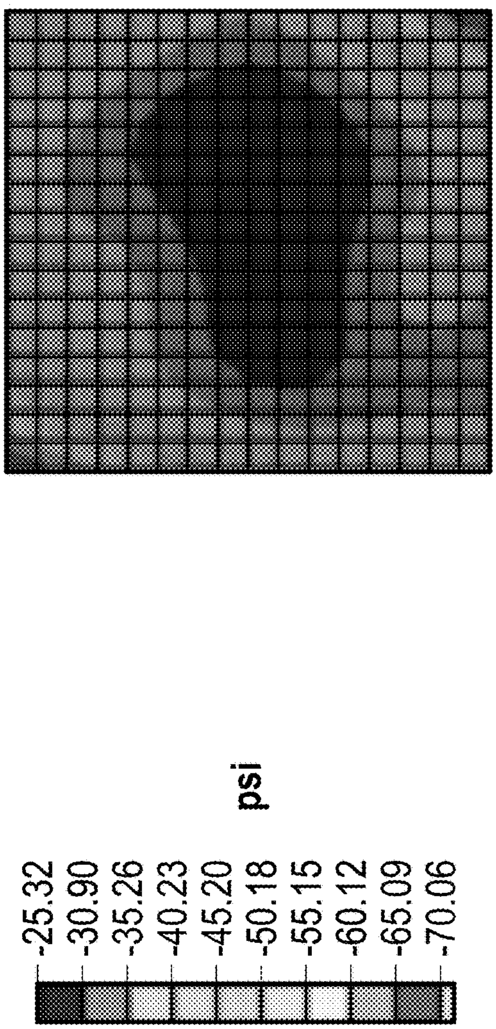
FIGS. 11A-11B illustrate simulated mechanical load across the integrated circuit dies in single-processor and dual-processor mainboard configurations in which a vapor chamber is attached to the mainboard with four low-profile fasteners.
Figure 11B:
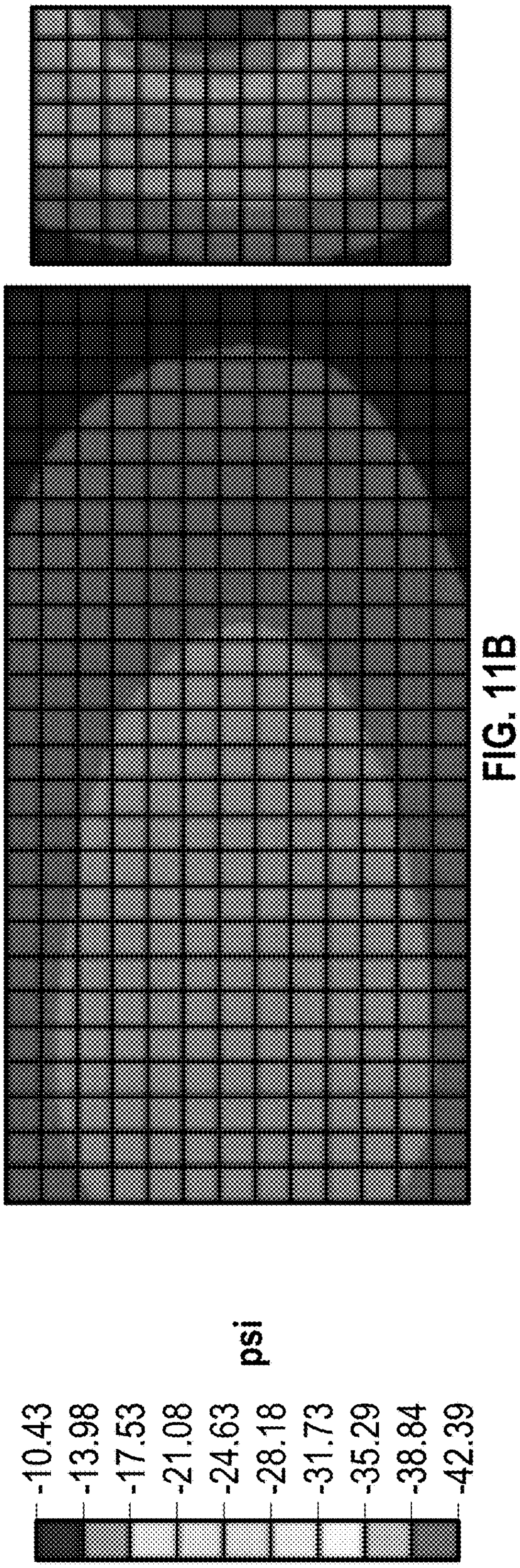

The arrangement of the fasteners 920 and 1020 can allow for a desired mechanical load to be applied to vapor chambers 904 and 1004, respectively. FIGS. 11A and 11B illustrate a simulated mechanical load across the integrated circuit dies in single-processor (FIG. 11A) and dual-processor mainboard configurations (FIG. 11B) in which a vapor chamber is attached to the mainboard with four low-profile fasteners. FIGS. 12A and 12B illustrate a simulated mechanical load across a single-processor (FIG. 12A) and dual-processor mainboard configurations (FIG. 12B) in which a vapor chamber is attached to the mainboard with three low-profile fasteners. The total mechanical load on the processor packages associated with the simulation results in FIG. 11A and FIG. 11B is 8.71 lbf (pounds-force) and 6.81 lbf (combined load for the two packages), respectively, and the total mechanical load on the processor packages associated with the simulation results in FIG. 12A and FIG. 12B are 7.7 lbf and 7.1 lbf (combined load for the two packages), respectively.

The technologies described herein can be implemented in a variety of computing systems, including mobile computing systems (e.g., handheld computers, tablet computers, laptop computers, portable gaming consoles, 2-in-1 convertible computers, portable all-in-one computers), non-mobile computing systems (e.g., desktop computers, servers, workstations, stationary gaming consoles, set-top boxes, smart televisions, rack-level computing solutions (e.g., blade, tray, or sled computing systems)), and embedded computing systems (e.g., computing systems that are part of a vehicle, smart home appliance, consumer electronics product or equipment, manufacturing equipment). As used herein, the term “computing system” includes computing devices and includes systems comprising multiple discrete physical components. In some embodiments, the computing systems are located in a data center, such as an enterprise data center (e.g., a data center owned and operated by a company and typically located on company premises), managed services data center (e.g., a data center managed by a third party on behalf of a company), a colocated data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves).

Figure 13:
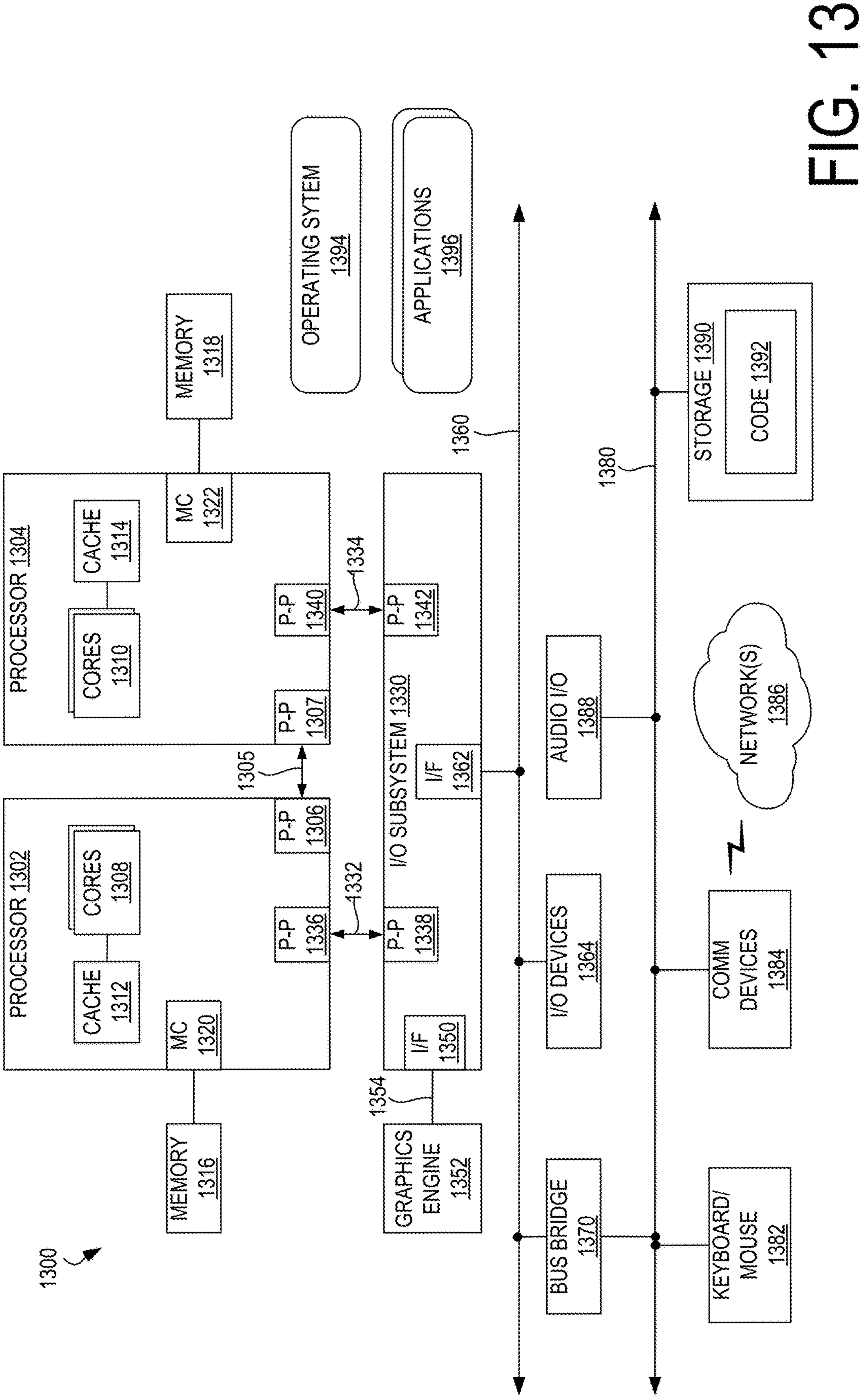
FIG. 13 is a block diagram of an example computing system within which any of the low-profile fasteners described herein can be utilized.

FIG. 13 is a block diagram of an example computing system in which technologies described herein may be implemented. Generally, components shown in FIG. 13 can communicate with other shown components, although not all connections are shown, for ease of illustration. The computing system 1300 is a multiprocessor system comprising a first processor unit 1302 and a second processor unit 1304 comprising point-to-point (P-P) interconnects. A point-to-point (P-P) interface 1306 of the processor unit 1302 is coupled to a point-to-point interface 1307 of the processor unit 1304 via a point-to-point interconnection 1305. It is to be understood that any or all of the point-to-point interconnects illustrated in FIG. 13 can be alternatively implemented as a multi-drop bus, and that any or all buses illustrated in FIG. 13 could be replaced by point-to-point interconnects.

The processor units 1302 and 1304 comprise multiple processor cores. Processor unit 1302 comprises processor cores 1308 and processor unit 1304 comprises processor cores 1310. Processor cores 1308 and 1310 can execute computer-executable instructions.

Processor units 1302 and 1304 further comprise cache memories 1312 and 1314, respectively. The cache memories 1312 and 1314 can store data (e.g., instructions) utilized by one or more components of the processor units 1302 and 1304, such as the processor cores 1308 and 1310. The cache memories 1312 and 1314 can be part of a memory hierarchy for the computing system 1300. For example, the cache memories 1312 can locally store data that is also stored in a memory 1316 to allow for faster access to the data by the processor unit 1302. In some embodiments, the cache memories 1312 and 1314 can comprise multiple cache levels, such as level 1 (L1), level 2 (L2), level 3 (L3), level 4 (L4) and/or other caches or cache levels. In some embodiments, one or more levels of cache memory (e.g., L2, L3, L4) can be shared among multiple cores in a processor unit or among multiple processor units in an integrated circuit component. In some embodiments, the last level of cache memory on an integrated circuit component can be referred to as a last level cache (LLC). One or more of the higher levels of cache levels (the smaller and faster caches) in the memory hierarchy can be located on the same integrated circuit die as a processor core and one or more of the lower cache levels (the larger and slower caches) can be located on integrated circuit dies that are physically separate from the processor core integrated circuit dies.

Although the computing system 1300 is shown with two processor units, the computing system 1300 can comprise any number of processor units. Further, a processor unit can comprise any number of processor cores. A processor unit can take various forms such as a central processor unit (CPU), a graphics processor unit (GPU), general-purpose GPU (GPGPU), accelerated processor unit (APU), field-programmable gate array (FPGA), neural network processor unit (NPU), data processor unit (DPU), accelerator (e.g., graphics accelerator, digital signal processor (DSP), compression accelerator, artificial intelligence (AI) accelerator), controller, or other types of processor units. As such, the processor unit can be referred to as an XPU (or xPU). Further, a processor unit can comprise one or more of these various types of processor units. In some embodiments, the computing system comprises one processor unit with multiple cores, and in other embodiments, the computing system comprises a single processor unit with a single core. As used herein, the terms “processor” and “processor unit” can refer to any processor, processor core, component, module, engine, circuitry, or any other processing element described or referenced herein.

In some embodiments, the computing system 1300 can comprise one or more processor units that are heterogeneous or asymmetric to another processor unit in the computing system. There can be a variety of differences between the processor units in a system in terms of a spectrum of metrics of merit including architectural, microarchitectural, thermal, power consumption characteristics, and the like. These differences can effectively manifest themselves as asymmetry and heterogeneity among the processor units in a system.

The processor units 1302 and 1304 can be located in a single integrated circuit component (such as a multi-chip package (MCP) or multi-chip module (MCM)) or they can be located in separate integrated circuit components. An integrated circuit component comprising one or more processor units can comprise additional components, such as embedded DRAM, stacked high bandwidth memory (HBM), shared cache memories (e.g., L3, L4, LLC), input/output (I/O) controllers, or memory controllers. Any of the additional components can be located on the same integrated circuit die as a processor unit, or on one or more integrated circuit dies separate from the integrated circuit dies comprising the processor units. In some embodiments, these separate integrated circuit dies can be referred to as “chiplets”. In some embodiments where there is heterogeneity or asymmetry among processor units in a computing system, the heterogeneity or asymmetry can be among processor units located in the same integrated circuit component. In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Processor units 1302 and 1304 further comprise memory controller logic (MC) 1320 and 1322. As shown in FIG. 13, MCs 1320 and 1322 control memories 1316 and 1318 coupled to the processor units 1302 and 1304, respectively. The memories 1316 and 1318 can comprise various types of volatile memory (e.g., dynamic random-access memory (DRAM), static random-access memory (SRAM)) and/or non-volatile memory (e.g., flash memory, chalcogenide-based phase-change non-volatile memories), and comprise one or more layers of the memory hierarchy of the computing system. While MCs 1320 and 1322 are illustrated as being integrated into the processor units 1302 and 1304, in alternative embodiments, the MCs can be external to a processor unit.

Processor units 1302 and 1304 are coupled to an Input/Output (I/O) subsystem 1330 via point-to-point interconnections 1332 and 1334. The point-to-point interconnection 1332 connects a point-to-point interface 1336 of the processor unit 1302 with a point-to-point interface 1338 of the I/O subsystem 1330, and the point-to-point interconnection 1334 connects a point-to-point interface 1340 of the processor unit 1304 with a point-to-point interface 1342 of the I/O subsystem 1330. Input/Output subsystem 1330 further includes an interface 1350 to couple the I/O subsystem 1330 to a graphics engine 1352. The I/O subsystem 1330 and the graphics engine 1352 are coupled via a bus 1354.

The Input/Output subsystem 1330 is further coupled to a first bus 1360 via an interface 1362. The first bus 1360 can be a Peripheral Component Interconnect Express (PCIe) bus or any other type of bus. Various I/O devices 1364 can be coupled to the first bus 1360. A bus bridge 1370 can couple the first bus 1360 to a second bus 1380. In some embodiments, the second bus 1380 can be a low pin count (LPC) bus. Various devices can be coupled to the second bus 1380 including, for example, a keyboard/mouse 1382, audio I/O devices 1388, and a storage device 1390, such as a hard disk drive, solid-state drive, or another storage device for storing computer-executable instructions (code) 1392 or data. The code 1392 can comprise computer-executable instructions for performing methods described herein. Additional components that can be coupled to the second bus 1380 include communication device(s) 1384, which can provide for communication between the computing system 1300 and one or more wired or wireless networks 1386 (e.g., Wi-Fi, cellular, or satellite networks) via one or more wired or wireless communication links (e.g., wire, cable, Ethernet connection, radio-frequency (RF) channel, infrared channel, Wi-Fi channel) using one or more communication standards (e.g., IEEE 802.11 standard and its supplements).

In embodiments where the communication devices 1384 support wireless communication, the communication devices 1384 can comprise wireless communication components coupled to one or more antennas to support communication between the computing system 1300 and external devices. The wireless communication components can support various wireless communication protocols and technologies such as Near Field Communication (NFC), IEEE 802.11 (Wi-Fi) variants, WiMax, Bluetooth, Zigbee, 4G Long Term Evolution (LTE), Code Division Multiple Access (CDMA), Universal Mobile Telecommunication System (UMTS) and Global System for Mobile Telecommunication (GSM), and 5G broadband cellular technologies. In addition, the wireless modems can support communication with one or more cellular networks for data and voice communications within a single cellular network, between cellular networks, or between the computing system and a public switched telephone network (PSTN).

The system 1300 can comprise removable memory such as flash memory cards (e.g., SD (Secure Digital) cards), memory sticks, Subscriber Identity Module (SIM) cards. The memory in system 1300 (including caches 1312 and 1314, memories 1316 and 1318, and storage device 1390) can store data and/or computer-executable instructions for executing an operating system 1394 and application programs 1396. Example data includes web pages, text messages, images, sound files, and video data to be sent to and/or received from one or more network servers or other devices by the system 1300 via the one or more wired or wireless networks 1386, or for use by the system 1300. The system 1300 can also have access to external memory or storage (not shown) such as external hard drives or cloud-based storage.

The operating system 1394 can control the allocation and usage of the components illustrated in FIG. 13 and support the one or more application programs 1396. The application programs 1396 can include common computing system applications (e.g., email applications, calendars, contact managers, web browsers, messaging applications) as well as other computing applications.

The computing system 1300 can support various additional input devices, such as a touchscreen, microphone, monoscopic camera, stereoscopic camera, trackball, touchpad, trackpad, proximity sensor, light sensor, and one or more output devices, such as one or more speakers or displays. Other possible input and output devices include piezoelectric and other haptic I/O devices. Any of the input or output devices can be internal to, external to, or removably attachable with the system 1300. External input and output devices can communicate with the system 1300 via wired or wireless connections.

The system 1300 can further include at least one input/output port comprising physical connectors (e.g., USB, IEEE 1394 (FireWire), Ethernet, RS-232), a power supply (e.g., battery), a global satellite navigation system (GNSS) receiver (e.g., GPS receiver), a gyroscope, an accelerometer, and/or a compass. A GNSS receiver can be coupled to a GNSS antenna. The computing system 1300 can further comprise one or more additional antennas coupled to one or more additional receivers, transmitters, and/or transceivers to enable additional functions.

In addition to those already discussed, integrated circuit components, integrated circuit constituent components, and other components in the computing system 1300 can communicate with interconnect technologies such as Intel® QuickPath Interconnect (QPI), Intel® Ultra Path Interconnect (UPI), Compute Express Link (CXL), cache coherent interconnect for accelerators (CCIX®), serializer/deserializer (SERDES), Nvidia® NVLink, ARM Infinity Link, Gen-Z, or Open Coherent Accelerator Processor Interface (OpenCAPI). Other interconnect technologies may be used and a computing system 1300 may utilize one or more interconnect technologies.

It is to be understood that FIG. 13 illustrates only one example computing system architecture. Computing systems based on alternative architectures can be used to implement technologies described herein. For example, instead of the processors 1302 and 1304 and the graphics engine 1352 being located on discrete integrated circuits, a computing system can comprise an SoC (system-on-a-chip) integrated circuit incorporating multiple processors, a graphics engine, and additional components. Further, a computing system can connect its constituent components via bus or point-to-point configurations different from that shown in FIG. 13. Moreover, the illustrated components in FIG. 13 are not required or all-inclusive, as shown components can be removed and other components added in alternative embodiments.

As used in this application and the claims, a list of items joined by the term "and/or" can mean any combination of the listed items. For example, the phrase "A, B and/or C" can mean A; B; C; A and B; A and C; B and C; or A, B and C. As used in this application and the claims, a list of items joined by the term "at least one of" can mean any combination of the listed terms. For example, the phrase "at least one of A, B or C" can mean A; B; C; A and B; A and C; B and C; or A, B, and C. Moreover, as used in this application and the claims, a list of items joined by the term "one or more of" can mean any combination of the listed terms. For example, the phrase "one or more of A, B and C" can mean A; B; C; A and B; A and C; B and C; or A, B, and C.

The disclosed methods, apparatuses, and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

As used in this application and the claims, the phrase "individual of" or "respective of" followed by a list or plurality of items recited or stated as having a trait, feature, etc. means that all the items in the list possess the stated or recited trait, feature, etc. For example, the phrase "individual of A, B, or C, are circular" or "respective of A, B, or C, are circular" means that A is circular, B is circular, and C is circular.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

The following examples pertain to additional embodiments of technologies disclosed herein.

Example 1 comprises an apparatus comprising a shaft having a cylindrical shape, the shaft comprising threads located on an outer surface of the shaft along at least a portion of a length of the shaft; and a diaphragm spring located at an end of the shaft, the diaphragm spring coaxially aligned with the shaft.

Example 2 comprises the apparatus of Example 1, wherein the diaphragm spring comprises a plurality of spokes extending radially outward from a central axis of the diaphragm spring.

Example 3 comprises the apparatus of any of Examples 1 or 2, and wherein the diaphragm spring further comprises an outer portion, individual of the spokes attached to the outer portion and physically separated from an adjacent spoke by a gap extending along a length of the individual spoke.

Example 4 comprises the apparatus of any of Examples 1-3, and wherein the gap comprises a cutout at an end of the gap proximal to the outer portion, a width of the cutout greater than a width of the gap at a point along the gap that does not include the cutout.

Example 5 comprises the apparatus of any of Examples 1-4, and wherein the cutout is substantially circular.

Example 6 comprises the apparatus of any one of Examples 3-5, wherein the outer portion of the diaphragm spring is substantially circular.

Example 7 comprises the apparatus of any one of Examples 1-6, wherein an outer diameter of the diaphragm spring is in the range of six to eight millimeters when the diaphragm spring is compressed.

Example 8 comprises the apparatus of any one of Examples 1-7, wherein the diaphragm spring is attached to the end of the shaft.

Example 9 comprises the apparatus of any one of Examples 1-7, wherein the diaphragm spring is physically separate from the shaft, a diameter of the shaft at the end of the shaft is greater than a diameter of the shaft along the remainder of the shaft, the diaphragm spring comprising an opening at its center, the opening having an opening diameter larger than the diameter of the shaft along the remainder of the shaft and smaller than the diameter at the end of the shaft, the diaphragm spring to slide over the remainder of the shaft and abut against the end of the shaft.

Example 10 comprises the apparatus of any one of Examples 1-9, wherein the end of the shaft comprises a drive to receive a drive tool.

Example 11 comprises the apparatus of any one of Examples 1-10, further comprising a nut to receive the threads of the shaft.

Example 12 comprises the apparatus of any one of Examples 1-11, further comprising a fastener comprising the shaft and the diaphragm spring; and a heat transfer device, the heat transfer device comprising a surface, a hole, and a recess in the surface in a vicinity of the hole, the end of the shaft not extending past the surface of the heat transfer device when the fastener is inserted into the hole and the diaphragm spring is compressed. Example 13 comprises the apparatus of any one of Examples 1-11, further comprising a fastener comprising the shaft and the diaphragm spring; and a heat transfer device, the heat transfer device comprising a surface, a hole, and a recess in the surface in a vicinity of the hole, a depth of the recess greater than a combined height of the diaphragm spring and a portion of the shaft that extends beyond the diaphragm spring when the fastener is inserted into the hole and the diaphragm spring is compressed.

Example 14 comprises the apparatus of Example 12 or 13, wherein the surface of the heat transfer device is a top surface, the heat transfer device further comprising a bottom surface opposite the top surface, the bottom surface comprising a step located in the vicinity of the hole, the step extending outwards from the bottom surface of the heat transfer device.

Example 15 comprises the apparatus of Example 14, wherein the heat transfer device comprises a top plate comprising the recess and a bottom plate comprising the step.

Example 16 comprises the apparatus of any one of Examples 1-10, further comprising a fastener comprising the shaft and the diaphragm spring; and a heat transfer device, the heat transfer device comprising a surface and a nut located on the surface, the nut to receive the threads of the shaft of the fastener. Example 17 comprises the apparatus of any one of Examples 1-10, further comprising a fastener comprising the shaft and the diaphragm spring; a heat transfer device; one or more processor units; a printed circuit board; and a nut, wherein the nut is located on a surface of the printed circuit board, the heat transfer device is attached to the printed circuit board via the fastener being fastened to the nut, the heat transfer device located on the one or more processor units when the fastener is fastened to the nut.

Example 18 comprises the apparatus of Example 11, and wherein the fastener is a first fastener, the shaft is a first shaft, the diaphragm spring is a first diaphragm spring, and the nut is a first nut, the apparatus further comprising two second fasteners, individual of the second fasteners comprising a second shaft having a cylindrical shape, the second shaft comprising threads located on an outer surface of the second shaft along at least a portion of a length of the second shaft; and a second diaphragm spring located at an end of the second shaft, the second diaphragm spring coaxially aligned with the second shaft; and two second nuts located on the surface of the printed circuit board, the heat transfer device further attached to the printed circuit board via individual of the second fasteners being attached to one of the second nuts.

Example 19 comprises the apparatus of Example 11, and wherein the fastener is a first fastener, the shaft is a first shaft, the diaphragm spring is a first diaphragm spring, and the nut is a first nut, the apparatus further comprising three second fasteners, individual of the second fasteners comprising a second shaft having a cylindrical shape, the second shaft comprising threads located on an outer surface of the second shaft along at least a portion of a length of the second shaft; and a second diaphragm spring located at an end of the second shaft, the second diaphragm spring coaxially aligned with the second shaft; and three second nuts located on the surface of the printed circuit board, the heat transfer device further attached to the printed circuit board via individual of the second fasteners being attached to one of the second nuts.

Example 20 comprises the apparatus of any one of Examples 1-11, further comprising a fastener comprising the shaft and the diaphragm spring; a heat transfer device; one or more processor units; a printed circuit board; and a nut, wherein the nut is located on a surface of the heat transfer device, the heat transfer device is attached to the printed circuit board via the fastener being attached to the nut, the heat transfer device located on the one or more processor units when the fastener is fastened to the nut.

Example 21 comprises the apparatus of any of Examples 1-20, and wherein the fastener is a first fastener, the shaft is a first shaft, the diaphragm spring is a first diaphragm spring, and the nut is a first nut, the apparatus further comprising two second fasteners, individual of the second fasteners comprising a second shaft having a cylindrical shape, the second shaft comprising threads located on an outer surface of the second shaft along a portion of the second shaft; a second diaphragm spring located at an end of the second shaft, the second diaphragm spring coaxially aligned with the second shaft; and two second nuts located on the surface of the heat transfer device, the heat transfer device further attached to the printed circuit board via individual of the second fasteners being attached to one of the second nuts.

Example 22 comprises the apparatus of any of Examples 1-21, and wherein the fastener is a first fastener, the shaft is a first shaft, the diaphragm spring is a first diaphragm spring, and the nut is a first nut, the apparatus further comprising three second fasteners, individual of the second fasteners comprising a second shaft having a cylindrical shape the second shaft comprising threads located on an outer surface of the second shaft along a portion of the second shaft; a second diaphragm spring located at an end of the second shaft, the diaphragm spring coaxially aligned with the second shaft; and three second nuts located on the surface of the printed circuit board, the heat transfer device further attached to the printed circuit board via individual of the second fasteners being attached to one of the second nuts.

Example 23 comprises the apparatus of any one of Examples 17-22, wherein the one or more processor units are at least two processor units, the printed circuit board comprising a first portion on which the at least two processor units are located, the apparatus further comprising a first fan located in a first cutout of the printed circuit board adjacent to a first edge of the first portion of the printed circuit board; and a second fan located adjacent to a second edge of the first portion of the printed circuit board, the second edge of the printed circuit board located opposite the first edge of the printed circuit board, a width of the first portion of the printed circuit board from the first edge to the second edge being less than about 100 millimeters.

Example 24 comprises the apparatus of any one of Examples 17-22, wherein the heat transfer device is a vapor chamber.

Example 25 comprises the apparatus of any one of Examples 17-22, wherein the heat transfer device is a heat pipe.

Example 26 comprises the apparatus of any one of Examples 17-22, wherein the heat transfer device is a cold plate.

Example 27 comprises an apparatus comprising a shaft having a cylindrical shape, the shaft comprising threads located on an outer surface of the shaft along at least a portion of a length of the shaft; and a wave spring located at an end of the shaft, the wave spring coaxially aligned with the shaft.

Example 28 comprises the apparatus of Example 27, and wherein the wave spring is a single wave spring.

Example 29 comprises the apparatus of any of Examples 27 and 28, and wherein the wave spring is a split wave spring.

Example 30 comprises the apparatus of any one of Examples 27-29, wherein the wave spring is attached to the end of the shaft.

Example 31 comprises the apparatus of any one of Examples 27-29, wherein the wave spring is physically separate from the shaft, a diameter of the shaft at the end of the shaft is greater than a diameter of the shaft along the remainder of the shaft, the wave spring comprising an opening at its center, the opening having an opening diameter larger than the diameter of the shaft along the remainder of the shaft and smaller than the diameter at the end of the shaft, the wave spring to slide over the remainder of the shaft and abut against the end of the shaft.

Example 32 comprises the apparatus of any one of Examples 27-31, wherein the end of the shaft comprises a drive to receive a drive tool.

Example 33 comprises the apparatus of any one of Examples 27-32, further comprising a nut to receive the threads of the shaft.

Example 34 comprises the apparatus of any one of Examples 27-33, further comprising a fastener comprising the shaft and the wave spring; and a heat transfer device, the heat transfer device comprising a surface, a hole, and a recess in the surface in a vicinity of the hole, the end of the shaft not extending past the surface of the heat transfer device when the fastener is inserted into the hole and the wave spring is compressed. Example 35 comprises the apparatus of any one of Examples 27-33, further comprising a fastener comprising the shaft and the wave spring; and a heat transfer device, the heat transfer device comprising a surface, a hole, and a recess in the surface in a vicinity of the hole, a depth of the recess greater than a combined height of the wave spring and a portion of the shaft that extends beyond the wave spring when the fastener is inserted into the hole and the wave spring is compressed.

Example 36 comprises the apparatus of Example 34 or 35, wherein the surface of the heat transfer device is a top surface, the heat transfer device further comprising a bottom surface opposite the top surface, the bottom surface comprising a step located in the vicinity of the hole, the step extending outwards from the bottom surface of the heat transfer device.

Example 37 comprises the apparatus of Example 36, wherein the heat transfer device comprises a top plate comprising the recess and a bottom plate comprising the step.

Example 38 comprises the apparatus of any one of Examples 27-37, further comprising a fastener comprising the shaft and the wave spring; and a heat transfer device, the heat transfer device comprising a surface and a nut located on the surface, the nut to receive the threads of the shaft of the fastener.

Example 39 comprises the apparatus of any one of Examples 27-32, further comprising a fastener comprising the shaft and the wave spring; a heat transfer device; one or more processor units; a printed circuit board; and a nut, wherein the nut is located on a surface of the printed circuit board, the heat transfer device is attached to the printed circuit board via the fastener being fastened to the nut, the heat transfer device located on the one or more processor units when the fastener is fastened to the nut.

Example 40 comprises the apparatus of any of Examples 27-39, and wherein the fastener is a first fastener, the shaft is a first shaft, the wave spring is a first wave spring, and the nut is a first nut, the apparatus further comprising two second fasteners, individual of the second fasteners comprising a second shaft having a cylindrical shape, the second shaft comprising threads located on an outer surface of the second shaft along at least a portion of a length of the second shaft; and a second wave spring located at an end of the second shaft, the second wave spring coaxially aligned with the second shaft; and two second nuts located on the surface of the printed circuit board, the heat transfer device further attached to the printed circuit board via individual of the second fasteners being attached to one of the second nuts.

Example 41 comprises the apparatus of any of Examples 27-40, and wherein the fastener is a first fastener, the shaft is a first shaft, the wave spring is a first wave spring, and the nut is a first nut, the apparatus further comprising three second fasteners, individual of the second fasteners comprising a second shaft having a cylindrical shape, the second shaft comprising threads located on an outer surface of the second shaft along at least a portion of a length of the second shaft; and a second wave spring located at an end of the second shaft, the second wave spring coaxially aligned with the second shaft; and three second nuts located on the surface of the printed circuit board, the heat transfer device further attached to the printed circuit board via individual of the second fasteners being attached to one of the second nuts.

Example 42 comprises the apparatus of any one of Examples 27-32, further comprising a fastener comprising the shaft and the wave spring; a heat transfer device; one or more processor units; a printed circuit board; and a nut, wherein the nut is located on a surface of the heat transfer device, the heat transfer device is attached to the printed circuit board via the fastener being attached to the nut, the heat transfer device located on the one or more processor units when the fastener is fastened to the nut.

Example 43 comprises the apparatus of any of Examples 27-42, and wherein the fastener is a first fastener, the shaft is a first shaft, the wave spring is a first wave spring, and the nut is a first nut, the apparatus further comprising two second fasteners, individual of the second fasteners comprising a second shaft having a cylindrical shape, the second shaft comprising threads located on an outer surface of the second shaft along a portion of the second shaft; a second wave spring located at an end of the second shaft, the second wave spring coaxially aligned with the second shaft; and two second nuts located on the surface of the heat transfer device, the heat transfer device further attached to the printed circuit board via individual of the second fasteners being attached to one of the second nuts.

Example 44 comprises the apparatus of any of Examples 27-43, and wherein the fastener is a first fastener, the shaft is a first shaft, the wave spring is a first wave spring, and the nut is a first nut, the apparatus further comprising three second fasteners, individual of the second fasteners comprising a second shaft having a cylindrical shape, the second shaft comprising threads located on an outer surface of the second shaft along a portion of the second shaft; a second wave spring located at an end of the second shaft, the second wave spring coaxially aligned with the second shaft; and three second nuts located on the surface of the printed circuit board, the heat transfer device further attached to the printed circuit board via individual of the second fasteners being attached to one of the second nuts.

Example 45 comprises the apparatus of any one of Examples 39-44, wherein the one or more processor units are at least two processor units, the printed circuit board comprising a first portion on which the at least two processor units are located, the apparatus further comprising a first fan located in a first cutout of the printed circuit board adjacent to a first edge of the first portion of the printed circuit board; and a second fan located adjacent to a second edge of the first portion of the printed circuit board, the second edge of the printed circuit board located opposite the first edge of the printed circuit board, a width of the first portion of the printed circuit board from the first edge to the second edge being less than about 100 millimeters.

Example 46 comprises the apparatus of any one of Examples 39-44, wherein the heat transfer device is a vapor chamber.

Example 47 comprises the apparatus of any one of Examples 39-44, wherein the heat transfer device is a heat pipe.

Example 48 comprises the apparatus of any one of Examples 39-44, wherein the heat transfer device is a cold plate.

Example 49 comprises an apparatus comprising a printed circuit board; one or more processor units attached to the printed circuit board; a heat transfer device; and a fastening means to attach the heat transfer device to the printed circuit board.

Example 50 comprises the apparatus of Example 49, and wherein the heat transfer device is a vapor chamber.

Example 51 comprises the apparatus of any of Examples 49 and 50, and wherein the heat transfer device is a heat pipe.

Example 52 comprises the apparatus of any of Examples 49-51, and wherein the heat transfer device is a cold plate.

The invention claimed is:

1. An apparatus comprising:

a fastener comprising a shaft and a diaphragm spring, the shaft having a cylindrical shape, the shaft comprising threads located on an outer surface of the shaft along at least a portion of a length of the shaft, the diaphragm spring located at an end of the shaft, the diaphragm spring coaxially aligned with the shaft; and a heat transfer device, the heat transfer device comprising a surface, a hole, and a recess in the surface in a vicinity of the hole, the end of the shaft not extending past the surface of the heat transfer device when the fastener is inserted into the hole and the diaphragm spring is compressed.

2. The apparatus of claim 1, wherein the diaphragm spring comprises a plurality of spokes extending radially outward from a central axis of the diaphragm spring.

3. The apparatus of claim 2, wherein the diaphragm spring further comprises an outer portion, individual of the plurality of spokes attached to the outer portion and physically separated from an adjacent spoke by a gap extending along a length of the individual spoke.

4. The apparatus of claim 3, wherein the gap comprises a cutout at an end of the gap proximal to the outer portion, a width of the cutout greater than a width of the gap at a point along the gap that does not include the cutout.

5. The apparatus of claim 1, wherein the diaphragm spring is attached to the end of the shaft.

6. The apparatus of claim 1, wherein the diaphragm spring is physically separate from the shaft, a diameter of the shaft at the end of the shaft is greater than a diameter of the shaft along a remainder of the shaft, the diaphragm spring comprising an opening at its center, the opening having an opening diameter larger than the diameter of the shaft along the remainder of the shaft and smaller than the diameter at the end of the shaft, the diaphragm spring to slide over the remainder of the shaft and abut against the end of the shaft.

7. The apparatus of claim 1, wherein the surface of the heat transfer device is a top surface, the heat transfer device further comprising a bottom surface opposite the top surface, the bottom surface comprising a step located in the vicinity of the hole, the step extending outwards from the bottom surface of the heat transfer device.

8. The apparatus of claim 7, wherein the recess is a first recess and the step is a first step, wherein the heat transfer device comprises a top plate and a bottom plate, the hole extending through the top plate and the bottom plate, the top surface being a top surface of the top plate, the bottom surface being a bottom surface of the bottom plate, the first recess being in the top surface of the top plate, the first step extending from the bottom surface of the bottom plate, the bottom plate further comprising a second recess in a top surface of the bottom plate opposite the bottom surface and in the vicinity of the hole, the top plate further comprising a second step extending from a bottom surface of the top plate opposite the top surface and in the vicinity of the hole, and the second step fitting within the second recess of the bottom plate.

9. The apparatus of claim 1, wherein the heat transfer device comprises a nut located on the surface, the nut to receive the threads of the shaft of the fastener.

10. The apparatus of claim 1, further comprising:

one or more processor units;

a printed circuit board; and a nut, wherein the nut is located on a surface of the printed circuit board, the heat transfer device is attached to the printed circuit board via the fastener being fastened to the nut, the heat transfer device located on the one or more processor units when the fastener is fastened to the nut.

11. The apparatus of claim 10, wherein the fastener is a first fastener, the shaft is a first shaft, the diaphragm spring is a first diaphragm spring, and the nut is a first nut, the apparatus further comprising:

two second fasteners, individual of the two second fasteners comprising:

a second shaft having a cylindrical shape, the second shaft comprising threads located on an outer surface of the second shaft along at least a portion of a length of the second shaft; and a second diaphragm spring located at an end of the second shaft, the second diaphragm spring coaxially aligned with the second shaft; and two second nuts located on the surface of the printed circuit board, the heat transfer device further attached to the printed circuit board via individual of the two second fasteners being attached to one of the two second nuts.

12. The apparatus of claim 10, wherein the fastener is a first fastener, the shaft is a first shaft, the diaphragm spring is a first diaphragm spring, and the nut is a first nut, the apparatus further comprising:

three second fasteners, individual of the three second fasteners comprising:

a second shaft having a cylindrical shape, the second shaft comprising threads located on an outer surface of the second shaft along at least a portion of a length of the second shaft; and a second diaphragm spring located at an end of the second shaft, the second diaphragm spring coaxially aligned with the second shaft; and three second nuts located on the surface of the printed circuit board, the heat transfer device further attached to the printed circuit board via individual of the three second fasteners being attached to one of the three second nuts.

13. The apparatus of claim 10, wherein the one or more processor units are at least two processor units, the printed circuit board comprising a first portion on which the at least two processor units are located, the apparatus further comprising:

a first fan located in a first cutout of the printed circuit board adjacent to a first edge of the first portion of the printed circuit board; and a second fan located adjacent to a second edge of the first portion of the printed circuit board, the second edge of the printed circuit board located opposite the first edge of the printed circuit board, a width of the first portion of the printed circuit board from the first edge to the second edge being less than about 100 millimeters.

14. The apparatus of claim 10, wherein the heat transfer device is a vapor chamber or a heat pipe.

15. The apparatus of claim 1, further comprising:

one or more processor units;

a printed circuit board; and a nut, wherein the nut is located on a surface of the heat transfer device, the heat transfer device is attached to the printed circuit board via the fastener being attached to the nut, the heat transfer device located on the one or more processor units when the fastener is fastened to the nut.

16. An apparatus comprising:

a fastener comprising a shaft and a wave spring, the shaft having a cylindrical shape, the shaft comprising threads located on an outer surface of the shaft along at least a portion of a length of the shaft, a wave spring located at an end of the shaft, the wave spring coaxially aligned with the shaft; and a heat transfer device, the heat transfer device comprising a surface, a hole, and a recess in the surface in a vicinity of the hole, the end of the shaft not extending past the surface of the heat transfer device when the fastener is inserted into the hole and the wave spring is compressed.

17. The apparatus of claim 16, wherein the wave spring is attached to the end of the shaft.

18. The apparatus of claim 16, wherein the wave spring is physically separate from the shaft, a diameter of the shaft at the end of the shaft is greater than a diameter of the shaft along a remainder of the shaft, the wave spring comprising an opening at its center, the opening having an opening diameter larger than the diameter of the shaft along the remainder of the shaft and smaller than the diameter at the end of the shaft, the wave spring to slide over the remainder of the shaft and abut against the end of the shaft.

19. The apparatus of claim 16, further comprising:

one or more processor units;

a printed circuit board; and a nut, wherein the nut is located on a surface of the printed circuit board, the heat transfer device is attached to the printed circuit board via the fastener being fastened to the nut, the heat transfer device located on the one or more processor units when the fastener is fastened to the nut.

20. The apparatus of claim 16, further comprising:

one or more processor units;

a printed circuit board; and a nut, wherein the nut is located on a surface of the heat transfer device, the heat transfer device is attached to the printed circuit board via the fastener being attached to the nut, the heat transfer device located on the one or more processor units when the fastener is fastened to the nut.

21. The apparatus of claim 16, wherein the surface of the heat transfer device is a top surface, the heat transfer device further comprising a bottom surface opposite the top surface, the bottom surface comprising a step located in the vicinity of the hole, the step extending outwards from the bottom surface of the heat transfer device.

22. The apparatus of claim 21, wherein the recess is a first recess and the step is a first step, wherein the heat transfer device comprises a top plate and a bottom plate, the hole extending through the top plate and the bottom plate, the top surface being a top surface of the top plate, the bottom surface being a bottom surface of the bottom plate, the first recess being in the top surface of the top plate, the first step extending from the bottom surface of the bottom plate, the bottom plate further comprising a second recess in a top surface of the bottom plate opposite the bottom surface and in the vicinity of the hole, the top plate further comprising a second step extending from a bottom surface of the top plate opposite the top surface and in the vicinity of the hole, and the second step fitting within the second recess of the bottom plate.

23. An apparatus comprising:

a printed circuit board;

one or more processor units attached to the printed circuit board;

a heat transfer device; and a fastening means to attach the heat transfer device to the printed circuit board.

24. The apparatus of claim 23, wherein the heat transfer device is a vapor chamber or a heat pipe.

* * * * *